(12) United States Patent
Kim et al.

(10) Patent No.: US 12,340,746 B2
(45) Date of Patent: Jun. 24, 2025

(54) DISPLAY DEVICE

(71) Applicant: Samsung Display Co., LTD., Yongin-si (KR)

(72) Inventors: Ah Young Kim, Yongin-si (KR); Won Kyu Kwak, Yongin-si (KR); Kwang Sae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/484,345

(22) Filed: Oct. 10, 2023

(65) Prior Publication Data

US 2024/0119900 A1 Apr. 11, 2024

(30) Foreign Application Priority Data

Oct. 11, 2022 (KR) .......................... 10-2022-0130098
May 30, 2023 (KR) .......................... 10-2023-0069481

(51) Int. Cl.
*G09G 3/3233* (2016.01)
*G09G 3/32* (2016.01)
*G09G 3/3291* (2016.01)

(52) U.S. Cl.
CPC ............. *G09G 3/3233* (2013.01); *G09G 3/32* (2013.01); *G09G 3/3291* (2013.01); *G09G 2310/0275* (2013.01); *G09G 2320/0233* (2013.01); *G09G 2330/021* (2013.01)

(58) Field of Classification Search
CPC ...... G09G 3/3233; G09G 3/32; G09G 3/3291; G09G 2310/0275; G09G 2320/0233; G09G 2330/021; G09G 2300/0426; G09G 2300/0819; G09G 2300/0842; G09G 2300/0861; G09G 2310/0251; G09G 2310/0262; G09G 2310/0297; H10K 59/131; H10K 59/35
See application file for complete search history.

(56) References Cited

U.S. PATENT DOCUMENTS

2018/0341160 A1* 11/2018 Gong .................... H10K 59/131
2019/0130832 A1* 5/2019 Chang .................. G09G 3/3266
2022/0114939 A1* 4/2022 Kwak ....................... G09G 3/20

FOREIGN PATENT DOCUMENTS

| KR | 10-0762138 B1 | 10/2007 |
|---|---|---|
| KR | 10-2016-0108639 A | 9/2016 |
| KR | 10-2047005 B1 | 11/2019 |
| KR | 10-2058691 B1 | 12/2019 |
| KR | 10-2270632 B1 | 6/2021 |

* cited by examiner

*Primary Examiner* — Abhishek Sarma
(74) *Attorney, Agent, or Firm* — Womble Bond Dickinson (US) LLP

(57) ABSTRACT

A display device includes first emission areas, second emission areas, and third emission areas for respectively emitting colors of light, first pixel electrodes, second pixel electrodes, and third pixel electrodes overlapping the first emission areas, the second emission areas, and the third emission areas, respectively, first data lines respectively connected to the first pixel electrodes, and overlapping some of the first emission areas, second data lines respectively electrically connected to the second pixel electrodes, overlapping some others of the first emission areas, and being spaced apart from the first data lines, and a demultiplexer configured to divide and output corresponding portions of an input, which is received from one fan-out line, to the first data lines and the second data lines.

19 Claims, 11 Drawing Sheets

DISPLAY DEVICE

CROSS-REFERENCE TO RELATED APPLICATIONS

This application claims priority to, and the benefit of, Korean Patent Application No. 10-2022-0130098 filed on Oct. 11, 2022, and No. 10-2023-0069481 filed on May 30, 2023, in the Korean Intellectual Property Office, the contents of which in its entirety are herein incorporated by reference.

BACKGROUND

1. Field

The present disclosure relates to a display device.

2. Description of the Related Art

As the information society has developed, the demand for display devices for displaying images has diversified. For example, display devices have been applied to various electronic devices, such as smart phones, digital cameras, notebook computers, navigation systems, and smart televisions. Here, the display devices may be flat panel display devices, such as a liquid crystal display (LCD) device, a field emission display (FED) device, or an organic light-emitting diode (OLED) display device. Flat-panel light-emitting display devices, for example, include light-emitting elements capable of allowing pixels to emit light, and can thus display images without the need of backlight units for providing light to display panels.

SUMMARY

Aspects of the present disclosure provide a display device capable of reducing or preventing the likelihood of occurrence of data coupling when charging data lines, thereby reducing or preventing luminance differences from becoming visible.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments, a display device includes first emission areas, second emission areas, and third emission areas for respectively emitting colors of light, first pixel electrodes, second pixel electrodes, and third pixel electrodes overlapping the first emission areas, the second emission areas, and the third emission areas, respectively, first data lines respectively connected to the first pixel electrodes, and overlapping some of the first emission areas, second data lines respectively electrically connected to the second pixel electrodes, overlapping some others of the first emission areas, and being spaced apart from the first data lines, and a demultiplexer configured to divide and output corresponding portions of an input, which is received from one fan-out line, to the first data lines and the second data lines.

Some of the first data lines may be adjacent one another, and are electrically connected to some of first pixel electrodes overlapping the second data lines, wherein others of the first data lines are adjacent one another, and are electrically connected to others of the first pixel electrodes overlapping the first data lines.

The first data lines may respectively overlap some of the third emission areas, wherein the second data lines respectively overlap others of the third emission areas.

The first data lines may include adjacent pairs of the first data lines, wherein some of the first data lines are electrically connected to ones of the third pixel electrodes overlapping the second data lines, and wherein others of the first data lines are electrically connected to ones of the third pixel electrodes that overlap the others of the first data lines.

The second emission areas may be between respective ones of the first and second data lines in plan view.

The display device may further include first pixel circuits, second pixel circuits, and third pixel circuits for providing driving currents to the first pixel electrodes, the second pixel electrodes, and the third pixel electrodes, respectively, wherein the first data lines overlap the first pixel circuits and the third pixel circuits, and wherein the second data lines overlap the second pixel circuits.

Respective ones of the first data lines and the second data lines may be spaced apart from one another with the first pixel circuits and the second pixel circuits therebetween, or with the second pixel circuits and the third pixel circuits therebetween.

The first pixel circuits, the second pixel circuits, and the third pixel circuits may include a first transistor for controlling a driving current to be provided to a corresponding one of the first, second, or third pixel electrodes, a second transistor for supplying a data voltage to a gate electrode of the first transistor, a third transistor connected between the gate electrode of the first transistor and a source electrode of the first transistor, and a fourth transistor for discharging the gate electrode of the first transistor to a first initialization voltage.

The first and second transistors may include semiconductor regions including low-temperature polycrystalline silicon (LTPS), wherein the third and fourth transistors include oxide-based semiconductor regions.

The first emission areas and the third emission areas may be alternately arranged in a first direction, and in a second direction perpendicular to the first direction, wherein the second emission areas are spaced apart from the first emission areas or the third emission areas in a third direction between the first and second directions.

The first emission areas and the third emission areas may be alternately arranged in first rows and first columns, wherein the second emission areas are arranged in second rows between respective ones of the first rows, and in second columns between respective ones of the first columns.

According to one or more embodiments, a display device includes first emission areas, second emission areas, and third emission areas for emitting respective colors of light, first pixel electrodes, second pixel electrodes, and third pixel electrodes overlapping the first emission areas, the second emission areas, and the third emission areas, respectively, n-th, (n+1)-th, and (n+2)-th fan-out lines (n being a positive integer) for providing data voltages, an n-th first data line and an n-th second data line electrically connected to the n-th fan-out line, an (n+1)-th first data line and an (n+1)-th second data line electrically connected to the (n+1)-th fan-out line, and an (n+2)-th first data line and an (n+2)-th second data line electrically connected to the (n+2)-th fan-out line, wherein the n-th and (n+1)-th second data lines are adjacent to each other, and wherein the (n+1)-th and (n+2)-th first data lines are adjacent to each other, and are spaced from the n-th and (n+1)-th second data lines.

The (n+1)-th first data line and the (n+2)-th first data line may overlap some of the first emission areas, wherein the n-th second data line and the (n+1)-th second data line overlap others of the first emission areas.

The (n+1)-th first data line and the (n+2)-th first data line may overlap some of the third emission areas, wherein the n-th second data line and the (n+1)-th second data line overlap others of the third emission areas.

The second emission areas may be between the (n+1)-th second data line and the (n+2)-th first data line in plan view.

The (n+1)-th first data line may be electrically connected to some first pixel electrodes overlapping the n-th second data line and the (n+1)-th second data line, wherein the (n+2)-th first data line is electrically connected to other first pixel electrodes overlapping the (n+1)-th first data line and the (n+2)-th first data line.

The display device may further include first pixel circuits, second pixel circuits, and third pixel circuits for providing driving currents to the first pixel electrodes, the second pixel electrodes, and the third pixel electrodes, respectively, wherein the first data lines overlap the first pixel circuits and the third pixel circuits, and wherein the second data lines overlap the second pixel circuits.

The first pixel circuits and the second pixel circuits, or the second pixel circuits and the third pixel circuits, may be between the (n+1)-th first data line and the (n+1)-th second data line in plan view.

According to one or more embodiments, a display device includes first emission areas and second emission areas for emitting respective colors of light, first pixel electrodes and second pixel electrodes overlapping the first emission areas and the second emission areas, respectively, first data lines electrically connected to the first pixel electrodes, some of the first data lines being adjacent to one another, second data lines electrically connected to the second pixel electrodes, the second data lines being spaced apart from the first data lines, and some of the second data lines being adjacent to one another, and first pixel circuits and second pixel circuits for providing driving currents to the first pixel electrodes and the second pixel electrodes, respectively, wherein the first pixel circuits and the second pixel circuits include a first transistor for controlling a driving current to be provided to a corresponding first pixel electrode or a second pixel electrode, a second transistor for supplying a data voltage to a gate electrode of the first transistor, a third transistor connected between the gate electrode of the first transistor and a source electrode of the first transistor, and a fourth transistor for discharging the gate electrode of the first transistor to a first initialization voltage.

The first and second transistors may include semiconductor regions including low-temperature polycrystalline silicon (LTPS), wherein the third and fourth transistors include oxide-based semiconductor regions.

According to the aforementioned and other embodiments of the present disclosure, as first data lines and second data lines, which are spaced apart from the first data lines, are provided, the occurrence of data coupling can be reduced or prevented when charging the first data lines and the second data lines, and visibility of luminance differences caused by voltage variations can be reduced or prevented.

It should be noted that the aspects of the present disclosure are not limited to those described above, and other aspects of the present disclosure will be apparent from the following description.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
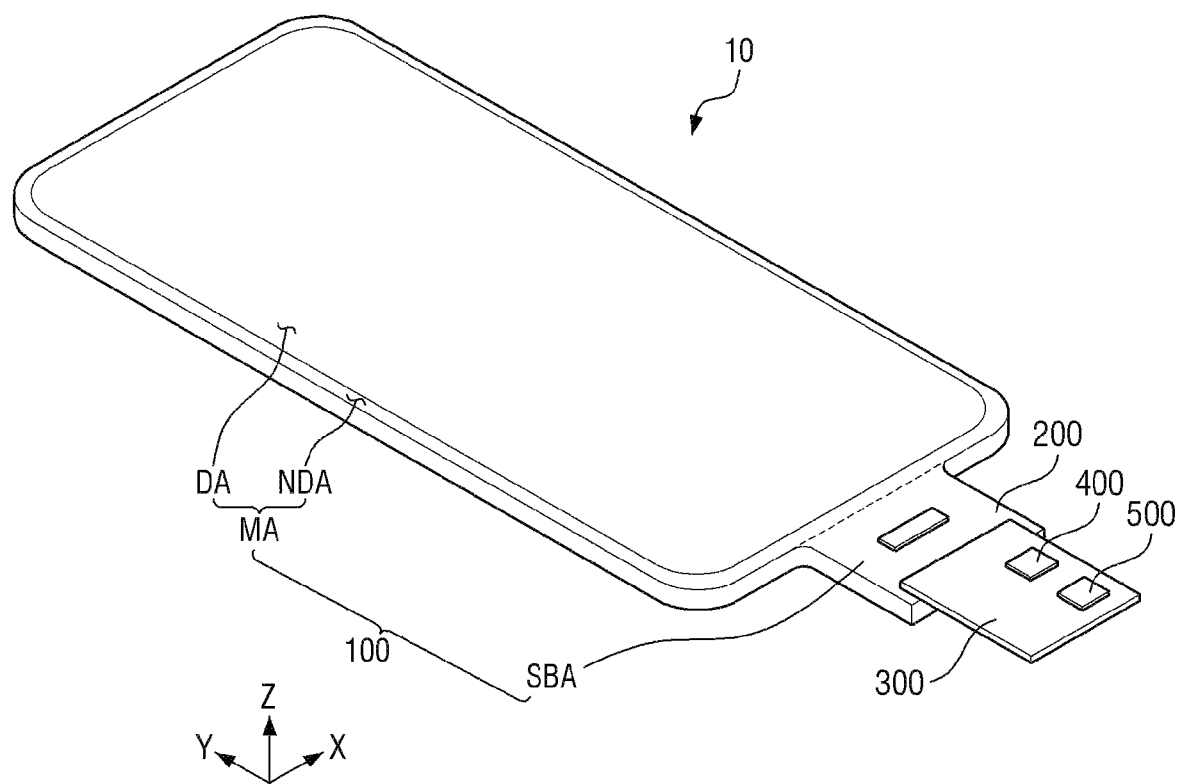
FIG. 1 is a perspective view of a display device according to one or more embodiments of the present disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of one or more embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When one or more embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view of a display device according to one or more embodiments of the present disclosure.

Referring to FIG. 1, a display device 10 may be applicable to a portable electronic device, such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). For example, the display device 10 may be used as the display of a television (TV), a laptop computer, a monitor, a billboard, or an Internet-of-Things (IoT) device. In another example, the display device 10 may be applicable to a wearable device, such as a smartwatch, a watchphone, a glasses display, or a head-mounted display (HMD).

The display device 10 may have a rectangle-like shape in plan view. For example, the display device 10 may have a rectangle-like shape having short sides in an X-axis direction in plan view, and long sides in a Y-axis direction in plan view. The corners where the short sides and the long sides meet may be rounded to have a curvature (e.g., predetermined curvature), or may be right-angled. The planar shape of the display device 10 is not particularly limited, and the display device 10 may have various other shapes, such as another polygonal shape, a circular shape, or an elliptical shape in plan view.

The display device 10 may include a display panel 100, a display driver 200, a circuit board 300, a touch driver 400, and a power supply 500.

The display panel 100 may include a main area MA and a subarea SBA. The main area MA may include a display area DA, which includes pixels for displaying an image, and a non-display area NDA, which is located around the display area DA. The display area DA may emit light through a plurality of emission areas or openings. For example, the display panel 100 may include pixel circuits including switching elements, a pixel-defining film defining the emission areas or the openings, and self-light-emitting elements.

For example, the self-light-emitting elements may include organic light-emitting diodes (OLEDs), quantum-dot light-emitting diodes (LEDs) including a quantum-dot light-emitting layer, inorganic LEDs including an inorganic semiconductor, and/or microLEDs, but the present disclosure is not limited thereto.

The non-display area NDA may be on the outside of the display area DA. The non-display area NDA may be defined as an edge part of the main area MA. The non-display area NDA may include a gate driver providing gate signals to gate lines and fan-out lines connecting the display driver 200 and the display area DA.

The subarea SBA may be an area extending from one side of the main area MA. The subarea SBA may include a flexible material that is bendable, foldable, or rollable. For example, in a case where the subarea SBA is bendable, the subarea SBA may be bent to overlap with the main area MA in a thickness direction (or a Z-axis direction). The subarea SBA may include the display driver 200 and a pad unit, which is connected to the circuit board 300. The subarea SBA may be optional, and the display driver 200 and the pad unit may be located in the non-display area NDA.

The display driver 200 may output signals and voltages for driving the display panel 100. The display driver 200 may provide data voltages to data lines. The display driver 200 may provide power supply voltages to power lines, and may provide gate control signals to the gate driver. The display driver 200 may be formed as an integrated circuit (IC), and may be mounted on the display panel 100 in a chip-on-glass (COG) or chip-on-plastic (COP) manner or via ultrasonic bonding. For example, the display driver 200 may be located in the subarea SBA, and may overlap with the main area MA in the thickness direction (or the Z-axis direction) when the subarea SBA is bent. In another example, the display driver 200 may be mounted on the circuit board 300.

The circuit board 300 may be attached to the pad unit of the display panel 100 via an anisotropic conductive film (ACF). Lead lines of the circuit board 300 may be electrically connected to the pad unit of the display panel 100. The circuit board 300 may be a printed circuit board (PCB), a flexible PCB (FPCB), or a flexible film, such as a chip-on-film (COF).

The touch driver 400 may be mounted on the circuit board 300. The touch driver 400 may be electrically connected to a touch sensor of the display panel 100. The touch driver 400 may provide a touch-driving signal to a plurality of touch electrodes of the touch sensor, and may sense capacitance variations between the touch electrodes. For example, the touch-driving signal may be a pulse signal having a frequency (e.g., predetermined frequency). The touch driver 400 may calculate the presence and coordinates of input based on the capacitance variations between the touch electrodes. The touch driver 400 may be formed as an integrated circuit (IC).

The power supply 500 may be located on the circuit board 300, and may provide a power supply voltage to the display driver 200 and the display panel 100. The power supply 500 may generate and provide a driving voltage to driving voltage lines, and may generate and provide a common voltage to a common electrode that light-emitting elements of pixels have in common. For example, the driving voltage may be a high-potential voltage for driving the light-emitting elements, and the common voltage may be a low-potential voltage for driving the light-emitting elements. The power supply 500 may generate and provide an initialization voltage to initialization lines, may generate and provide a reference voltage to reference voltage lines, and may generate and provide a bias voltage to bias voltage lines.

Figure 2:
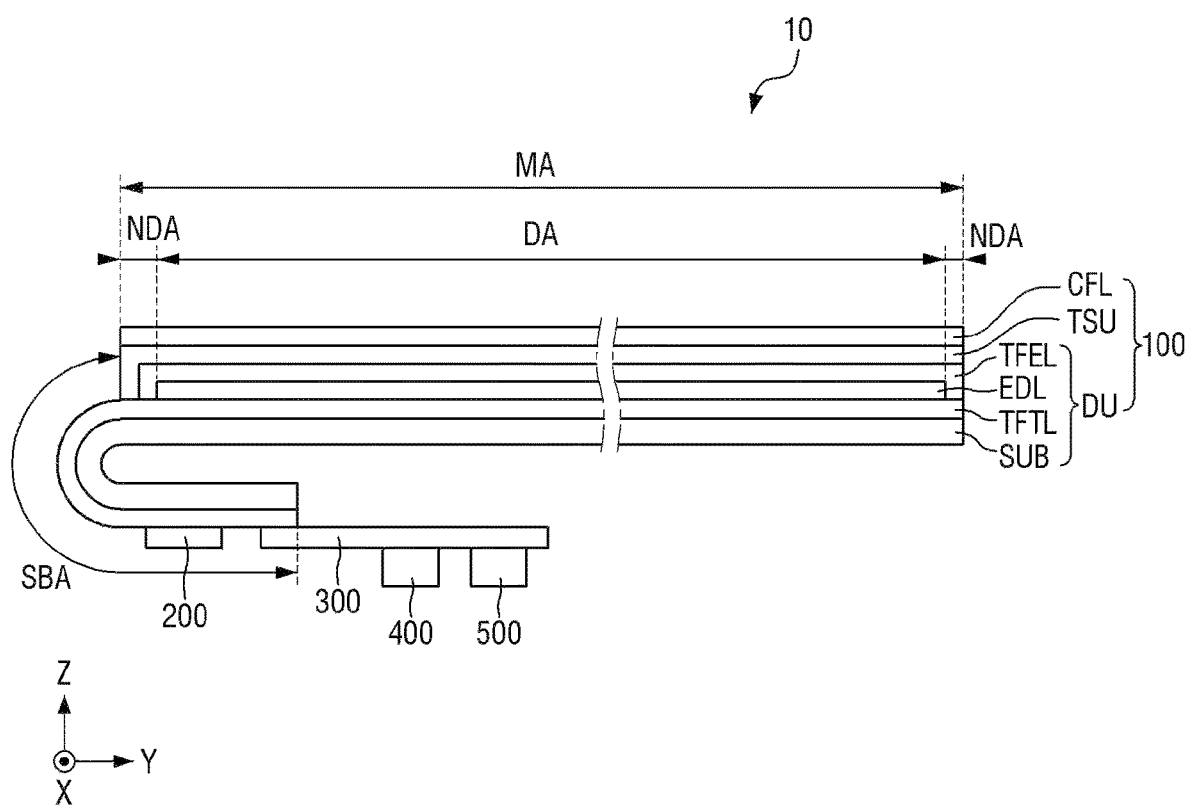
FIG. 2 is a cross-sectional view of the display device of FIG. 1.

FIG. 2 is a cross-sectional view of the display device of FIG. 2, as viewed from a side of the display device of FIG. 1.

Referring to FIG. 2, the display panel 100 may include a display DU, a touch sensor TSU, and a color filter layer CFL. The display DU may include a substrate SUB, a thin-film transistor (TFT) layer TFTL, a light-emitting element layer EDL, and an encapsulation layer TFEL.

The substrate SUB may be a base substrate or a base member. The substrate SUB may be a flexible substrate that is bendable, foldable, or rollable. For example, the substrate SUB may include a polymer resin, such as polyimide (PI), but the present disclosure is not limited thereto. In another example, the substrate SUB may include a glass material or a metal material.

The TFT layer TFTL may be located on the substrate SUB. The TFT layer TFTL may include a plurality of TFTs that form pixel circuitry. The TFT layer TFTL may further include gate lines, data lines, power lines, gate control lines, and fan-out lines connecting the display driver 200 and the data lines, and lead lines connecting the display driver 200 and the pad unit. The TFTs may include semiconductor regions, source electrodes, drain electrodes, and gate electrodes. For example, in a case where the gate driver is formed on one side of the non-display area NDA of the display panel 100, the gate driver may include TFTs.

The TFT layer TFTL may be located in the display area DA, the non-display area NDA, and the subarea SBA. The TFTs, the gate lines, the data lines, and the power lines of the TFT layer TFTL may be located in the display area DA. The gate control lines and the fan-out lines of the TFT layer TFTL may be located in the non-display area NDA. The lead lines of the TFT layer TFTL may be located in the subarea SBA.

The light-emitting element layer EDL may be located on the TFT layer TFTL. The light-emitting element layer EDL may include a plurality of light-emitting elements, in which pixel electrodes, light-emitting layers, and common electrodes are sequentially stacked to emit light, and a pixel-defining film, which defines the pixels. The light-emitting elements of the light-emitting element layer EDL may be located in the display area DA.

For example, the light-emitting layers may be organic light-emitting layers including an organic material. The light-emitting layers may include hole transport layers, organic light-emitting layers, and electron transport layers. As the pixel electrodes receive a voltage (e.g., predetermined voltage) through the TFTs of the TFT layer TFTL, and as the common electrodes receive a cathode voltage, holes may move to the organic light-emitting layers through the hole transport layers, electrons may move to the organic light-emitting layers through the electron transport layers, and the holes and the electrons may combine together in the organic light-emitting layers, thereby emitting light. For example, the pixel electrodes and the common electrodes may be anodes and cathodes, respectively, but the present disclosure is not limited thereto.

In another example, the light-emitting elements may be quantum-dot light-emitting diodes (LEDs) including quantum-dot light-emitting layers, inorganic LEDs including an inorganic semiconductor, or micro-LEDs.

The encapsulation layer TFEL may cover the top surface and sides of the light-emitting element layer EDL, and may protect the light-emitting element layer EDL. The encapsulation layer TFEL may include at least one inorganic film and at least one organic film for encapsulating the light-emitting element layer EDL.

The touch sensor TSU may be located on the encapsulation layer TFEL. The touch sensor TSU may include a plurality of touch electrodes for detecting touch input from a user in a capacitive manner, and touch lines for connecting the touch electrodes and the touch driver 400. The touch electrodes of the touch sensor TSU may be located in a touch sensor area overlapping with the display area DA. The touch lines of the touch sensor TSU may be located in a touch peripheral area overlapping with the non-display area NDA. For example, the touch sensor TSU may sense a touch input from the user in a mutual capacitance manner, or in a self-capacitance manner.

In another example, the touch sensor TSU may be located on a separate substrate, which is located on the display DU. In this example, the separate substrate may be a base member encapsulating the display DU.

The color filter layer CFL may be located on the touch sensor TSU. The color filter layer CFL may include the color filters (CF1, CF2, and CF3), which correspond to their respective emission areas. The color filters (CF1, CF2, and CF3) may selectively transmit light of a corresponding wavelength therethrough, and may reduce, block, or absorb light of other wavelengths. The color filters (CF1, CF2, and CF3) may reduce reflected light of external light by absorbing some of the external light. Accordingly, the color filters (CF1, CF2, and CF3) can reduce or prevent color distortion that may be caused by the external light.

As the color filer layer CFL is located directly on the touch sensor TSU, the display device 10 may not need a separate substrate for the color filter layer CFL. Thus, the thickness of the display device 10 can be reduced.

The subarea SBA of the display panel 100 may extend from a side of the main area MA. The subarea SBA may include a flexible material that is bendable, foldable, or rollable. For example, when the subarea SBA is bent down, the subarea SBA may overlap with the main area MA in the thickness direction (or the Z-axis direction). The subarea SBA may include a display driver 200 and a pad unit, which is electrically connected to a circuit board 300.

Figure 3:
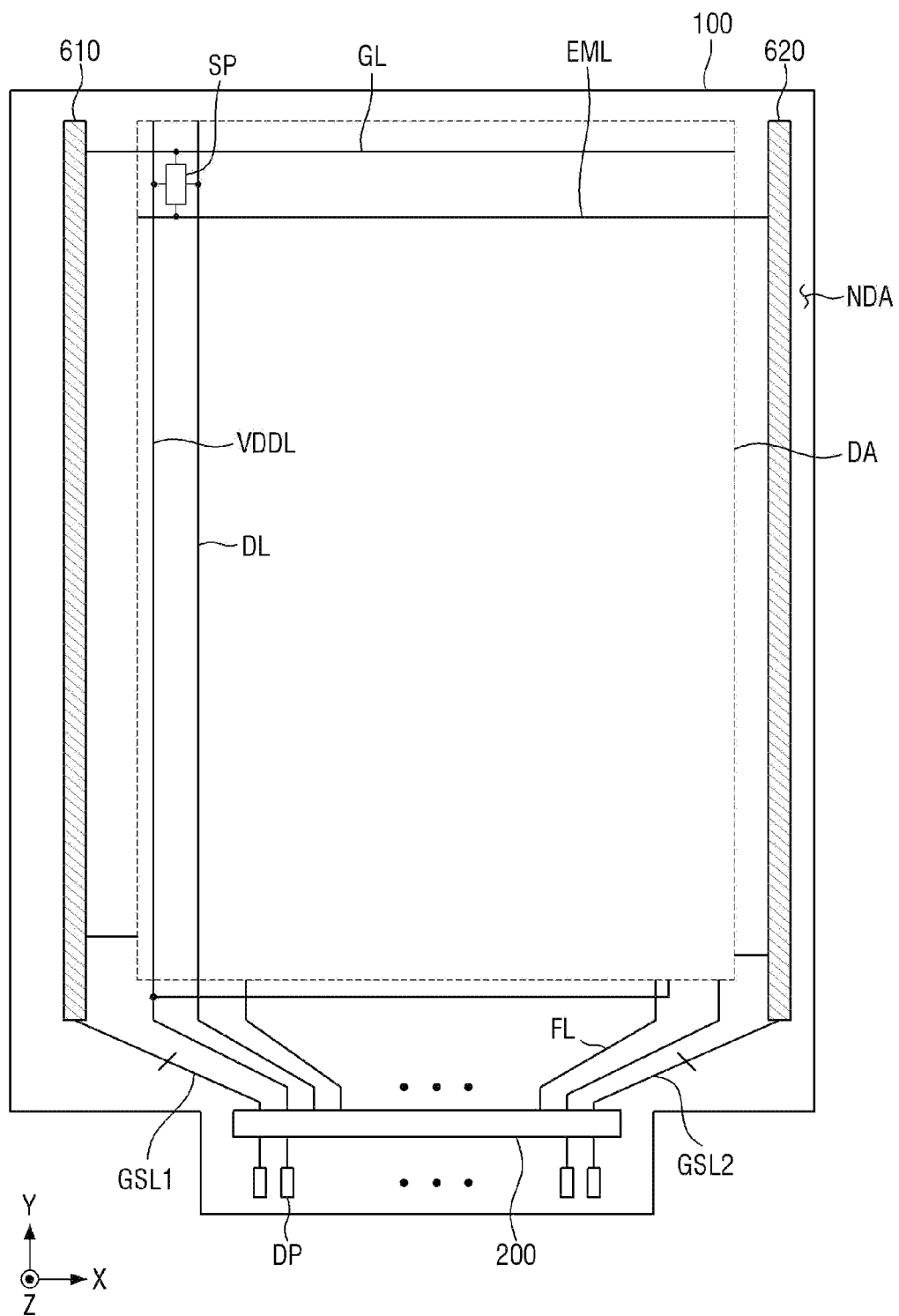
FIG. 3 is a plan view illustrating a display of the display device of FIG. 1.
Figure 4:
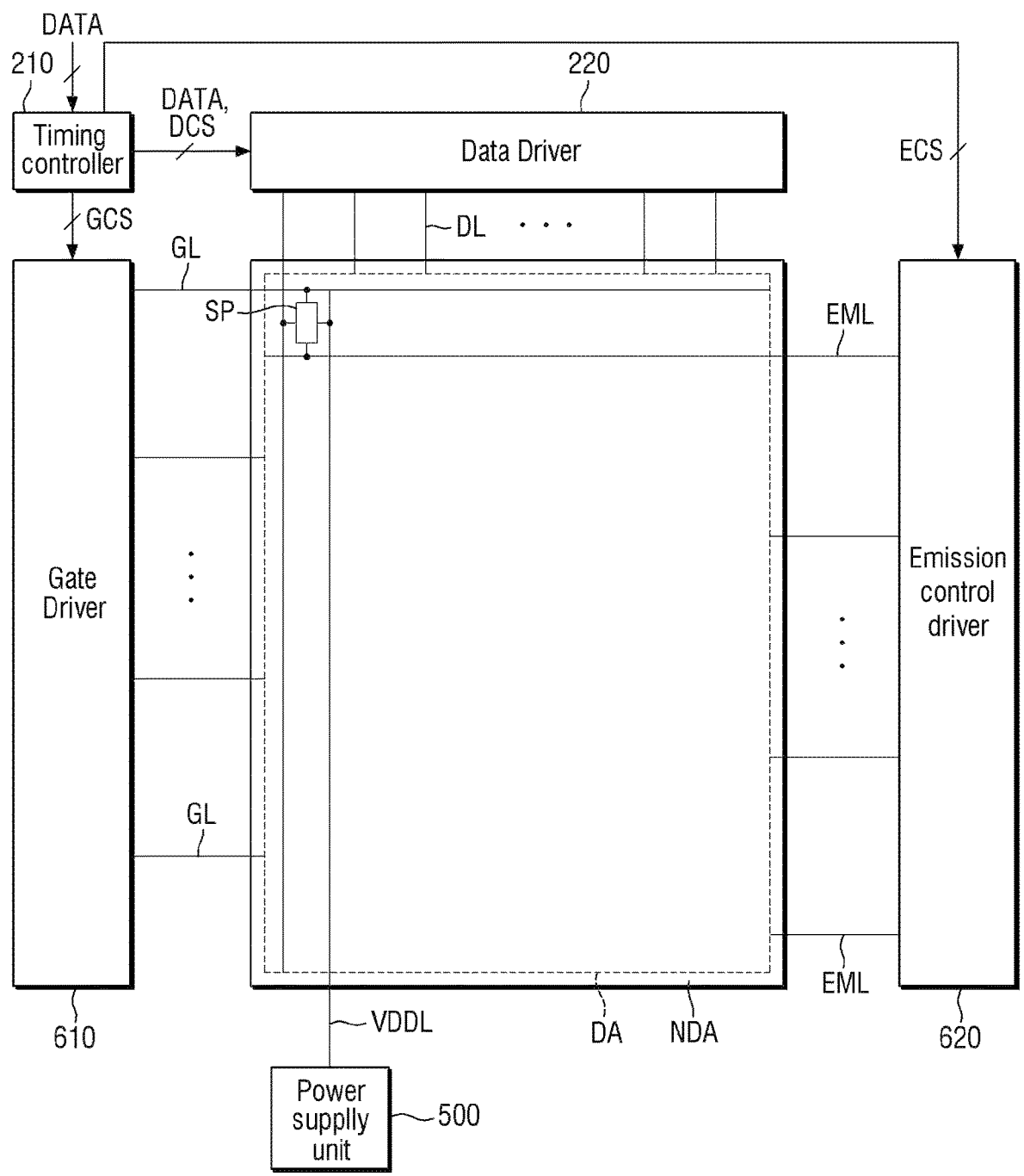
FIG. 4 is a block diagram illustrating a display panel and a display driver of the display device of FIG. 1.

FIG. 3 is a plan view illustrating the display of the display device of FIG. 1, and FIG. 4 is a block diagram illustrating the display panel and the display driver of the display device of FIG. 1.

Referring to FIGS. 3 and 4, the display panel 100 may include the display area DA and the non-display area NDA. The display area DA may include pixels SP, driving voltage lines VDDL, gate lines GL, emission control lines EML, and data lines DL.

The pixels SP may be connected to the gate lines GL, the data lines DL, the emission control lines EML, and the driving voltage lines VDDL. Each of the pixels SP may include one or more transistors, a light-emitting element, and a capacitor.

The gate lines GL may extend in the X-axis direction, and may be spaced apart from one another in the Y-axis direction, which intersects the X-axis direction. The gate lines GL may sequentially provide gate signals to the pixels SP.

The emission control lines EML may extend in the X-axis direction, and may be spaced apart from one another in the Y-axis direction. The emission control lines EML may sequentially provide emission signals to the pixels SP.

The data lines DL may extend in the Y-axis direction, and may be spaced apart from one another in the X-axis direction. The data lines DL may provide data voltages to the pixels SP. The data voltages may determine the luminances of the pixels SP.

The driving voltage lines VDDL may extend in the Y-axis direction, and may be spaced apart from one another in the X-axis direction. The driving voltage lines VDDL may provide a driving voltage to the pixels SP. The driving voltage may be a high-potential voltage for driving the light-emitting elements of the pixels SP.

The non-display area NDA may surround the display area DA. The non-display area NDA may include a gate driver 610, an emission control driver 620, fan-out lines FL, a first gate control line GSL1, and a second gate control line GSL2.

The fan-out lines FL may extend from the display driver 200 to the display area DA. The fan-out lines FL may provide the data voltage received from the display driver 200 to the data lines DL.

The first gate control line GSL1 may extend from the display driver 200 to the gate driver 610. The first gate control line GSL1 may provide gate control signals GCS received from the display driver 200 to the gate driver 610.

The second gate control line GSL2 may extend from the display driver 200 to the emission control driver 620. The second gate control line GSL2 may provide emission control signals ECS received from the display driver 200 to the emission control driver 620.

The subarea SBA may extend from a side of the non-display area NDA. The subarea SBA may include the display driver 200 and a pad unit DP. The pad unit DP may be located closer than the display driver 200 to an edge of the subarea SBA. The pad unit DP may be electrically connected to the circuit board 300 via an anisotropic conductive film (ACF).

The display driver 200 may include a timing controller 210 and a data driver 220. The timing controller 210 may receive digital video data "DATA" and timing signals from the circuit board 300. The timing controller 210 may generate data control signals DCS based on the timing signals, and may control the operation timing of the data driver 220, may generate the gate control signals GCS based on the timing signals, and may control the operation timing of the gate driver 610, and may generate the emission control signals ECS based on the timing signals, and may control the operation timing of the emission control driver 620. The timing controller 210 may provide the gate control signals to the gate driver 610 via the first gate control line GSL1. The timing controller 210 may provide the emission control signals ECS to the emission control driver 620 via the second gate control line GSL2. The timing controller 210 may provide the digital video data "DATA" and the data control signals DCS to the data driver 220.

The data driver 220 may convert the digital video data "DATA" into analog data voltages, and may provide the analog data voltages to the data lines DL through the fan-out lines FL. The gate signals from the gate driver 610 may select pixels SP to which the data voltages are to be provided, and the selected pixels SP may receive the data voltages through the data lines DL.

The power supply 500 may be located on the circuit board 300 to supply power supply voltages to the display driver 200 and the display panel 100. The power supply 500 may generate and supply a driving voltage to the driving voltage lines VDDL, and may generate and supply a common voltage to a common electrode that the light-emitting elements of the pixels SP have in common. The power supply 500 may generate and supply an initialization voltage to the initialization lines, may generate and supply a reference voltage to the reference voltage lines, and may generate and supply a bias voltage to the bias voltage lines.

The gate driver 610 may be located in part of the non-display area NDA on one side of the display area DA, and the emission control driver 620 may be located in part of the non-display area NDA on the other side of the display area DA. However, the present disclosure is not limited to this. Alternatively, the gate driver 610 and the emission control driver 620 may both be located in the non-display area NDA, on the same side of the display area DA.

The gate driver 610 may include a plurality of transistors, which generate gate signals based on the gate control signals GCS. The emission control driver 620 may include a plurality of transistors, which generate emission signals based on the emission control signals ECS. For example, the transistors of the gate driver 610 and the transistors of the emission control driver 620 may be formed in the same layer as the transistors of each of the pixels SP. The gate driver 610 may provide the gate signals to the gate lines GL, and the emission control driver 620 may provide the emission signals to the emission control lines EML.

Figure 5:
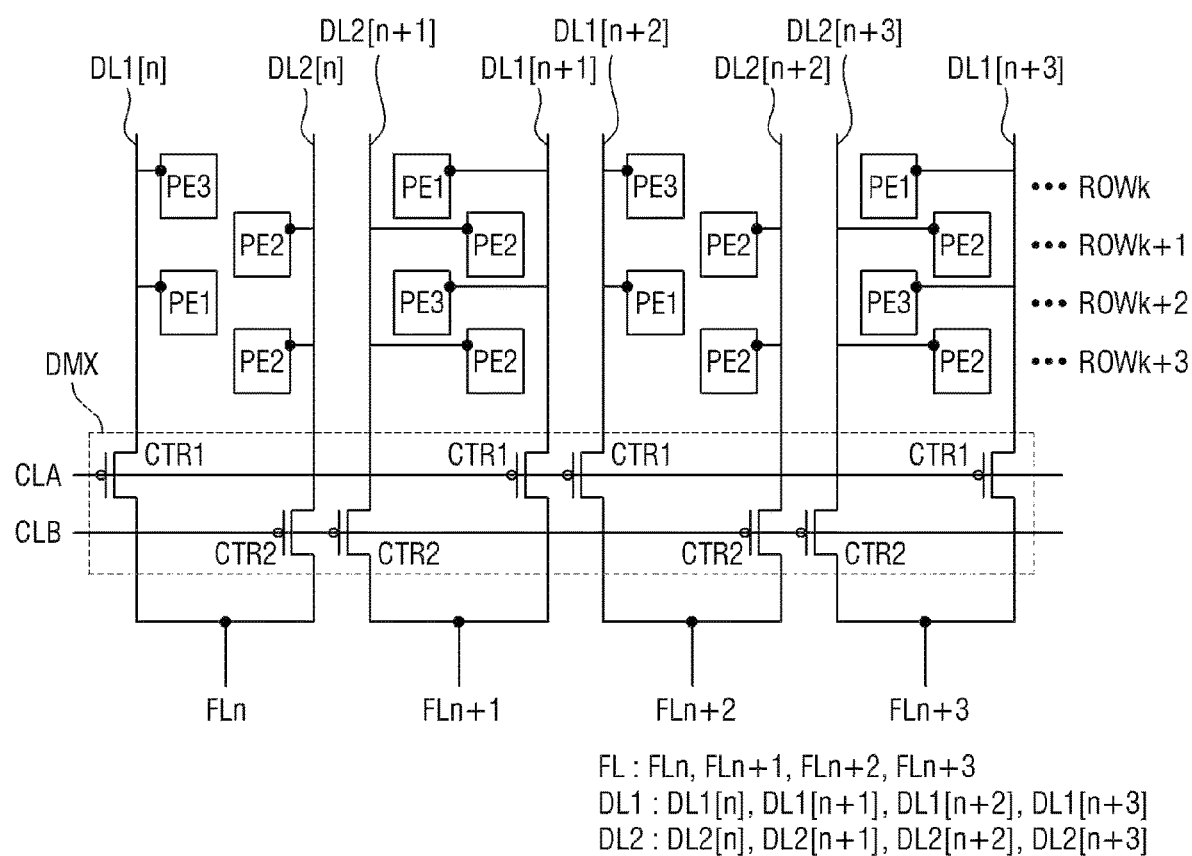
FIG. 5 illustrates the layout of pixels and data lines of the display device of FIG. 1.
Figure 6:
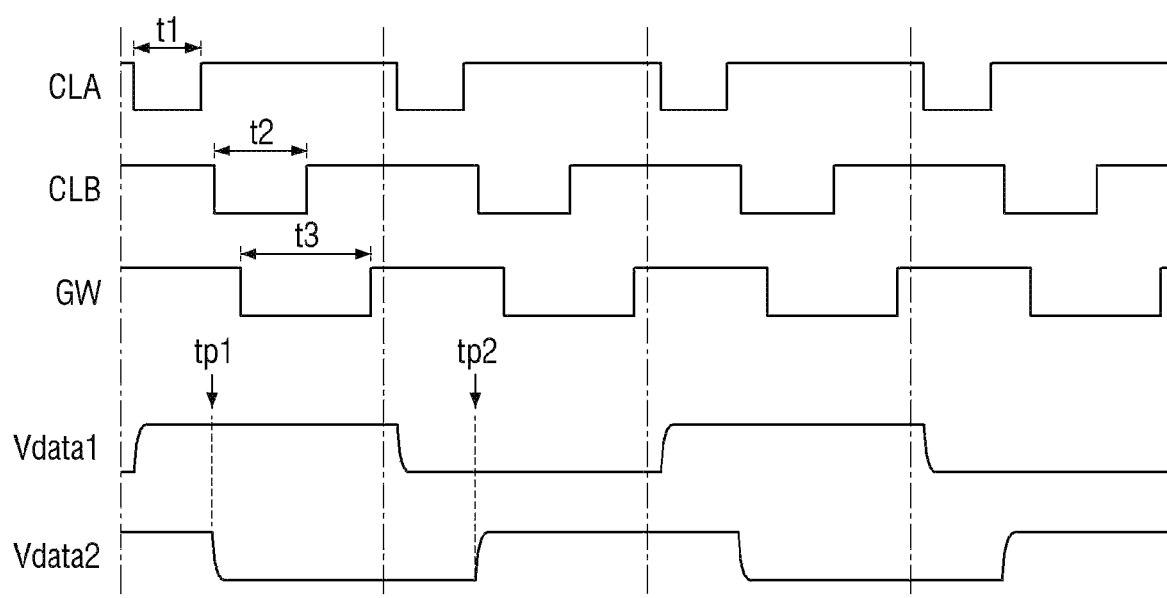
FIG. 6 is a waveform diagram illustrating signals provided to the pixels and control transistors of FIG. 5.

FIG. 5 illustrates the layout of the pixels and the data lines of the display device of FIG. 1, and FIG. 6 is a waveform diagram illustrating signals provided to the pixels and control transistors of FIG. 5.

Referring to FIGS. 5 and 6, the display device 10 may further include a demultiplexer DMX, which is located between the fan-out lines FL and the data lines DL (e.g., DL1 and DL2). The demultiplexer DMX may divide and output the output of the display driver 200, which is received through the fan-out lines FL, between first data lines DL1 and second data lines DL2. For example, the demultiplexer DMX may time-divide one input data into two output data, but the present disclosure is not limited thereto. In another example, the demultiplexer DMX may time-divide one input data into three or more output data using a high-frequency clock signal, and as the frequency of the clock signal increases, the number of fan-out lines FL may be reduced. The demultiplexer DMX may include first control transistors CTR1 and second control transistors CTR2.

During a first period t1, the first control transistors CTR1 may be turned on by a first control signal CLA to electrically connect the fan-out lines FL and the first data lines DL1.

During a second period t2, which follows the first period t1, the second control transistors CTR2 may be turned on by a second control signal CLB to electrically connect the fan-out lines FL and the second data lines DL2.

As the display device 10 includes the first control transistors CTR1 and the second control transistors CTR2, the display device 10 can drive twice as many data lines DL as there are fan-out lines FL. The display device 10 may improve the freedom of design, and may reduce cost by reducing the number of fan-out lines FL.

The fan-out lines FL may include n-th, (n+1)-th, (n+2)-th, and (n+3)-th fan-out lines FLn, FLn+1, FLn+2, and FLn+3 (where n is a positive integer).

The n-th fan-out line FLn may be electrically connected to n-th first and second data lines DL1[$n$] and DL2[$n$]. The (n+1)-th fan-out line FLn+1 may be electrically connected to (n+1)-th first and second data lines DL1[$n$+1] and DL2[$n$+1]. The (n+2)-th fan-out line FLn+2 may be electrically connected to (n+2)-th first and second data lines DL1[$n$+2] and DL2[$n$+2]. The (n+3)-th fan-out line FLn+3 may be electrically connected to (n+3)-th first and second data lines DL1[$n$+3] and DL2[$n$+3].

The first data lines DL1 may be electrically connected to first pixel electrodes PE1 and third pixel electrodes PE3, and the second data lines DL2 may be electrically connected to second pixel electrodes PE2. The first data lines DL1 may be charged with a first data voltage Vdata1 during the first period t1, and the second data lines DL2 may be charged with a second data voltage Vdata2 during the second period t2. During a third period t3, the first data lines DL1 and the second data lines DL2 may provide data voltages to the pixels SP in response to a scan write signal GW.

The first pixel electrodes PE1 and the third pixel electrodes PE3 may be alternately arranged in their respective rows and columns. Second pixel electrodes PE2 may be located in rows between the rows where the first pixel electrodes PE1 and the third pixel electrodes PE3 are located, and in columns between the columns where the first pixel electrodes PE1 and the third pixel electrodes PE3 are located. For example, the first pixel electrodes PE1 and the third pixel electrodes PE3 may be arranged in k-th and (k+2)-th rows ROWk and ROWk+2 (where k is a positive integer), and the second pixel electrodes PE2 may be arranged in (k+1)-th and (k+3)-th rows ROWk+1 and ROWk+3. The third pixel electrodes PE3 and the first pixel electrodes PE1 may be alternately arranged in an n-th left columns, and the second pixel electrodes PE2 may be arranged in an n-th right column. The first pixel electrodes PE1 and the third pixel electrodes PE3 may be alternately arranged in an (n+1)-th left column, and the second pixel electrodes PE2 may be arranged in an (n+1)-th right column. One first pixel electrode PE1, two second pixel electrodes PE2, and one third pixel electrode PE3 may be arranged in each unit area of the display area DA, but the present disclosure is not limited thereto.

The first data lines DL1 may be located adjacent to one another, and the second data lines DL2 may be located adjacent to one another. The first data lines DL1 may be spaced apart from the second data lines DL2 by the pixel circuits of the pixels SP. For example, the n-th and (n+1)-th second data lines DL2[$n$] and DL2[$n$+1] may be located adjacent to each other, the (n+1)-th and (n+2)-th first data lines DL1[$n$+1] and DL1[$n$+2] may be located adjacent to each other, and the (n+2)-th and (n+3)-th second data lines DL2[$n$+2] and DL2[$n$+3] may be located adjacent to each other.

The first data lines DL1 may provide a first data voltage Vdata1 having a first-color gray value to first pixels, and a first data voltage Vdata1 having a third-color gray value to third pixels. The second data lines DL2 may provide a second data voltage Vdata2 having a second-color gray value to second pixels. If the first data lines DL1 and the second data lines DL2 are located adjacent to one another, parasitic capacitance may be formed between the first data lines DL1 and the second data lines DL2, and data coupling may occur when the first data lines DL1 and the second data lines DL2 are charged. However, as the display device 10 includes the first data lines DL1 and the second data lines DL2, which are spaced apart from the first data lines DL1, data coupling can be reduced or prevented when the first data lines DL1 and the second data lines DL2 are charged, and as a result, visibility of luminance differences caused by voltage variations can be reduced or prevented. For example, data coupling can be reduced or prevented from occurring in the first data voltage Vdata1 at a first time tp1 or a second time tp2 due to the charging of the data lines DL with the second data voltage Vdata2.

Figure 7:
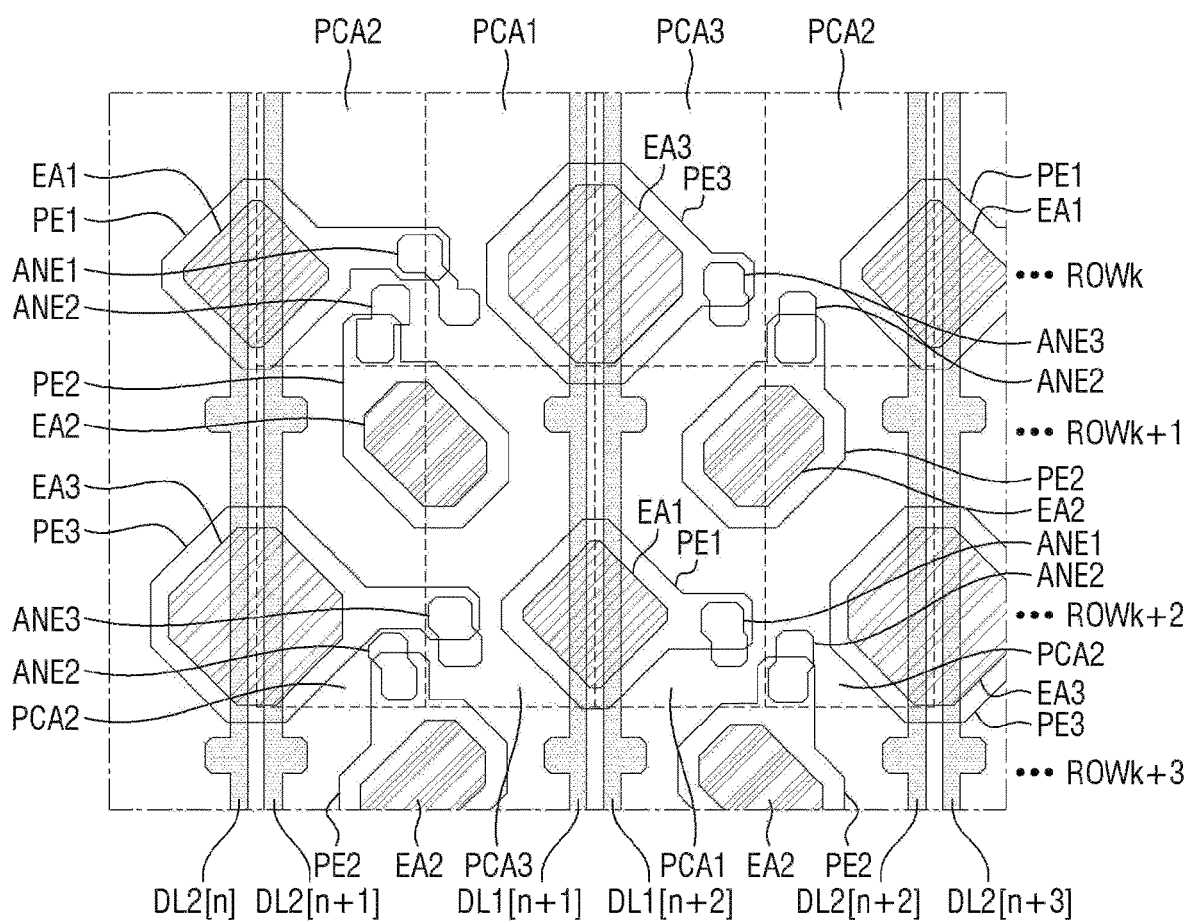
FIG. 7 is a plan view illustrating the data lines, pixel circuit areas, and pixel electrodes of the display device of FIG. 1.

FIG. 7 is a plan view illustrating the data lines, pixel circuit areas, and pixel electrodes of the display device of FIG. 1.

Referring to FIG. 7, the display device 10 may include a plurality of pixels SP, which are arranged in multiple rows and multiple columns. Each of the pixels SP may include first, second, and third emission areas EA1, EA2, and EA3, which are defined by a pixel-defining film (e.g., pixel-defining film PDL of FIG. 9), and may emit light having a peak wavelength (e.g., predetermined peak wavelength) through the first, second, and third emission areas EA1, EA2, and EA3. The first, second, and third emission areas EA1, EA2, and EA3 may be areas that emit light generated by the light-emitting element of each of the pixels SP to the outside of the display device 10.

First emission areas EA1, second emission areas EA2, and third emission areas EA3 may emit light having a peak wavelength (e.g., predetermined peak wavelength) to the outside of the display device 10. The first emission areas EA1 may emit first-color light, the second emission areas EA2 may emit second-color light, and the third emission areas EA3 may emit third-color light. For example, the first-color light may be red light having a peak wavelength of about 610 nm to about 650 nm, the second-color light may be green light having a peak wavelength of about 510 nm to about 550 nm, and the third-color light may be blue light having a peak wavelength of about 440 nm to about 480 nm. However, the present disclosure is not limited to this example.

The first emission areas EA1 and the third emission areas EA3 may be alternately arranged in first and second directions DR1 and DR2. The third emission areas EA3 may be located between the first emission areas EA1 in the first or second direction DR1 or DR2. The second emission areas EA2 may be adjacent to the first or third emission areas EA1 or EA3 in a third or fourth direction DR3 or DR4. The second emission areas EA2 may be located between the first emission areas EA1 in the third or fourth directions DR3 or DR4. The second emission areas EA2 may be located between the third emission areas EA3 in the third or fourth direction DR3 or DR4. The first emission areas EA1 may be surrounded by the second emission areas EA2. The second emission areas EA2 may be surrounded by the first emission areas EA1 and the third emission areas EA3. The third emission areas EA3 may be surrounded by the second emission areas EA2. For example, the third emission areas EA3 may have a larger size than the first emission areas EA1, and the first emission areas EA1 may have a larger size than the second emission areas EA2. However, the present disclosure is not limited to this example.

The first emission areas EA1 and the third emission areas EA3 may be alternately arranged in their respective rows and columns. The second emission areas EA2 may be arranged in rows that are between rows where the first emission areas EA1 and the third emission areas EA3 are located, and may be arranged in columns between columns where the first emission areas EA1 and the third emission areas EA3 are located. For example, the first emission areas EA1 and the third emission areas EA3 may be arranged in the k-th and (k+2)-th rows ROWk and ROWk+2 (where k is a positive integer), and the second emission areas EA2 may be arranged in the (k+1)-th and (k+3)-th rows ROWk+1 and ROWk+3.

The first emission areas EA1 and the third emission areas EA3 may be alternately arranged in the n-th left column, and the second emission areas EA2 may be arranged in the n-th right column. The third emission areas EA3 and the first emission areas EA1 may be alternately arranged in the (n+1)-th left column, and the second emission areas EA2 may be arranged in the (n+1)-th right column. One first emission area EA1, two emission areas EA2, and one third emission area EA3 may be arranged in each unit area of the display area DA, but the present disclosure is not limited thereto.

Figure 8:
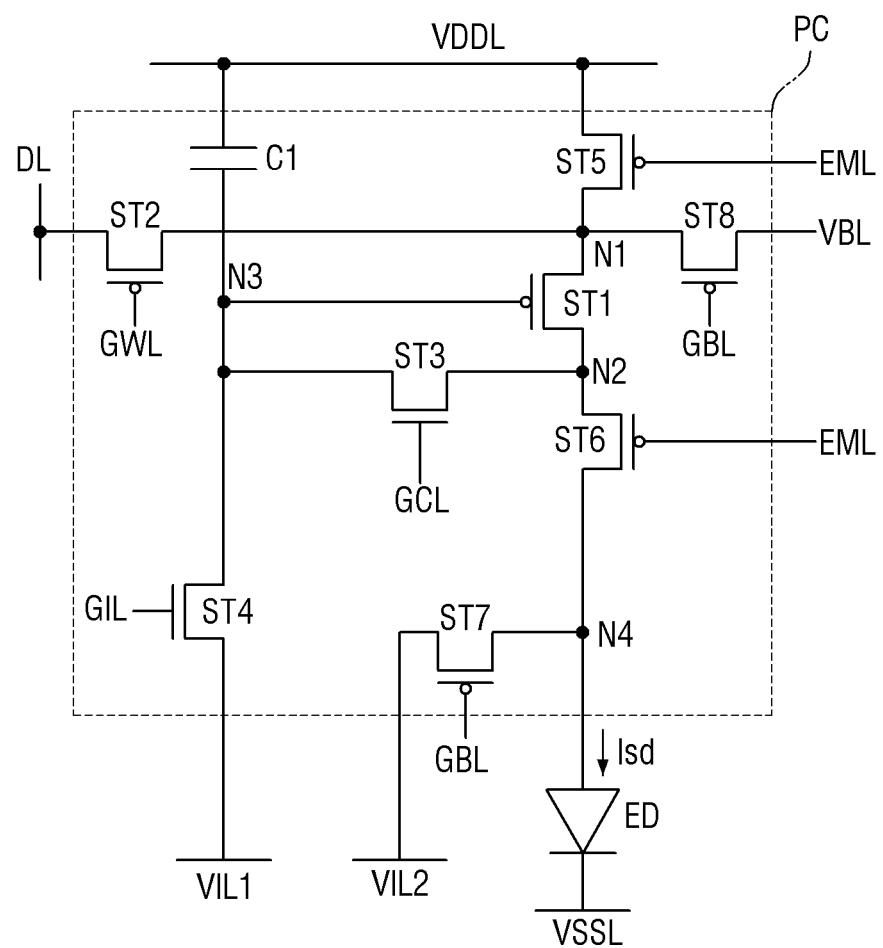
FIG. 8 is a circuit diagram of a pixel of the display device of FIG. 1.

Each of the pixels SP may include a pixel circuit (e.g., pixel circuit PC of FIG. 8), which is located in a pixel circuit area PCA, and a light-emitting element (e.g., light-emitting element ED of FIG. 8). The pixel circuit area PCA may include first pixel circuit areas PCA1, second pixel circuit areas PCA2, and third pixel circuit areas PCA3. The first pixel circuit areas PCA1 may include first pixel circuits, the second pixel circuit areas PCA2 may include second pixel circuits, and the third pixel circuit areas PCA3 may include third pixel circuits.

The n-th and (n+1)-th second data lines DL2[$n$] and DL2[$n$+1] may be located adjacent to each other. The (n+1)-th and (n+2)-th first data lines DL1[$n$+1] and DL1[$n$+2] may be located adjacent to each other. The (n+2)-th and (n+3)-th second data lines DL2[$n$+2] and DL2[$n$+3] may be located adjacent to each other. The (n+1)-th and (n+2)-th second data lines DL2[$n$+1] and DL2[$n$+2] may be spaced apart from each other with the (n+1)-th and (n+2)-th first data lines DL1[$n$+1] and DL1[$n$+2] interposed therebetween. Respective ones of the first data lines DL1 and the second data lines DL2 may be spaced apart from one another with the first pixel circuits and the second pixel circuits interposed therebetween, or with the second pixel circuits and the third pixel circuits interposed therebetween.

The first data lines DL1 may respectively overlap with the first pixel circuit areas PCA1. Contacts of the first data lines DL1 may protrude from the first data lines DL1 in the first direction DR1, or in the opposite direction of the first direction DR1, and may be electrically connected to the first pixel circuits, respectively. The first pixel circuit areas PCA1 located in the upper row and the contacts of the respective first data lines DL1 may overlap in an outer area of the FIG. 7. Therefore, all of the first pixel circuit areas PCA1 may respectively overlap the contacts of the first data line DL1. The first data lines DL1 may provide the first data voltage Vdata1 to the first pixel circuits. The first pixel circuits may apply a driving current to the first pixel electrodes PE1 through first anode connection electrodes ANE1, and the light-emitting elements of the first pixels may emit the first-color light through the first emission areas EA1.

The second data lines DL2 may respectively overlap with the second pixel circuit areas PCA2. Contacts of the second data lines DL2 may protrude from the second data lines DL2 in the first direction DR1, or in the opposite direction of the first direction DR1, and may be electrically connected to the second pixel circuits, respectively. The second pixel circuit areas PCA2 located in the upper row and the contacts of the respective second data lines DL2 may overlap in an outer area of the FIG. 7. Therefore, all of the second pixel circuit areas PCA2 may overlap the contacts of respective second data line DL2. The second data lines DL2 may provide the second data voltage Vdata2 to the second pixel circuits. The second pixel circuits may apply a driving current to the second pixel electrodes PE2 through second anode connection electrodes ANE2, and the light-emitting elements of the second pixels may emit the second-color light through the second emission areas EA2.

The first data lines DL1 may respectively overlap with the third pixel circuit areas PCA3. The contacts of the first data lines DL1 may protrude from the first data lines DL1 in the first direction DR1, or in the opposite direction of the first direction DR1, and may be electrically connected to the third pixel circuits, respectively. The third pixel circuit areas PCA3 located in the upper row and the contacts of respective first data lines DL1 may overlap in an outer area of the FIG. 7. Therefore, all of the third pixel circuit areas PCA3 may respectively overlap the contacts of the first data line DL1. The first data lines DL1 may provide the first data voltage Vdata1 to the third pixel circuits. The third pixel circuits may apply a driving current to the third pixel electrodes PE3 through third anode connection electrodes ANE3, and the light-emitting elements of the third pixels may emit the third-color light through the third emission areas EA3.

The first data lines DL1 and the second data lines DL2 may overlap with the first emission areas EA1 and the third emission areas EA3, while not overlapping with the second emission areas EA2. Some of the first pixel electrodes PE1 may be electrically connected to first pixel circuits in first pixel circuit areas PCA1 that are located farther than the second pixel circuit areas PCA2 (e.g., farther than edges of the second pixel circuit areas PCA2), which mostly overlap some of the first pixel electrodes PE1. First pixel electrodes PE1 overlapping with the second data lines DL2 may mainly overlap the second pixel circuit areas PCA2, and may be electrically connected to first pixel circuits in first pixel circuit areas PCA1 at a position that is distant from, or spaced apart from, the corresponding second pixel circuit areas PCA2. For example, a first pixel electrode PE1 in the k-th row ROWk that overlaps with the (n+1)-th second data line DL2[$n$+1] may be electrically connected to the (n+1)-th first data line DL1[$n$+1].

Some others of the first pixel electrodes PE1 may not overlap with the second pixel circuit areas PCA2. First pixel electrodes PE1 overlapping with the first data lines DL1 may overlap with more than half the first pixel circuit areas PCA1, and may be electrically connected to the first pixel circuits in the corresponding first pixel circuit areas PCA1. For example, first pixel electrodes PE1 overlapping with the [$n$+2]-th first data line DL1[$n$+2] may be electrically connected to the [$n$+2]-th first data line DL1[$n$+2].

Some of the first pixel electrodes PE1 may receive a driving current from relatively distant pixel circuits, and some others of the first pixel electrodes PE1 may receive a driving current from the first pixel circuits that they respectively overlap. Some of the first pixel electrodes PE1 may be electrically connected to first data lines DL1 that they do not overlap, and some others of the first pixel electrodes PE1 may be electrically connected to first data lines DL1 that they overlap. Accordingly, as the first data lines DL1 are located to be adjacent to one another, while being spaced apart from the second data lines DL2, the occurrence of data coupling can be reduced or prevented when charging the first data lines DL1 and the second data lines DL2.

The second pixel electrodes PE2 may be located between the first data lines DL1 and the second data lines DL2. The second pixel electrodes PE2 may be electrically connected to second pixel circuits in second pixel circuit areas PCA2 distant from second pixel circuit areas PCA2 that they respectively overlap. For example, second pixel electrodes PE2 in the (k+1)-th row ROWk+1 may be electrically connected to second pixel circuits in second pixel circuit areas PCA2 above the second pixel circuit areas PCA2 that they respectively overlap. Second pixel electrodes PE2 located between the (n+1)-th second data line DL2[$n$+1] and the (n+1)-th first data line DL1[$n$+1] may be electrically connected to the (n+1)-th second data line DL2[$n$+1]. Second pixel electrodes PE2 located between the (n+2)-th first and second data lines DL1[$n$+2] and DL2[$n$+2] may be electrically connected to the (n+2)-th second data line DL2[$n$+2]. The (n+1)-th and (n+2)-th second data lines DL2[$n$+1] and DL2[$n$+2] may be spaced apart from each other with the (n+1)-th and (n+2)-th first data lines DL1[$n$+1] and DL1[$n$+2] interposed therebetween.

Some of the third pixel electrodes PE3 may be electrically connected to third pixel circuits in third pixel circuit areas PCA3 located farther than the second pixel circuit areas PCA2, the second pixel circuit areas PCA2 mostly overlapping some of the third pixel electrodes PE3. Third pixel electrodes PE3 overlapping with the second data lines DL2 may mainly overlap the second pixel circuit areas PCA2, and may be electrically connected to third pixel circuits in third pixel circuit areas PCA3 that are more distant than the corresponding second pixel circuit areas PCA2. For example, a third pixel electrode PE3 in the (k+2)-th row ROWk+2 that overlaps with the (n+1)-th second data line DL2[$n$+1] may be electrically connected to the (n+1)-th first data line DL1[$n$+1].

Some others of the third pixel electrodes PE3 may not overlap with the second pixel circuit areas PCA2. Third pixel electrodes PE3 overlapping with the first data lines DL1 may overlap with more than half the third pixel circuit areas PCA3, and may be electrically connected to the third pixel circuits in the corresponding third pixel circuit areas PCA3. For example, third pixel electrodes PE3 overlapping with the [$n$+2]-th first data line DL1[$n$+2] may be electrically connected to the [$n$+2]-th first data line DL1[$n$+2].

Some of the third pixel electrodes PE3 may receive a driving current from relatively distant pixel circuits, and some others of the third pixel electrodes PE3 may receive a driving current from the third pixel circuits that they respectively overlap. Some of the third pixel electrodes PE3 may be electrically connected to first data lines DL1 that they do not overlap, and some others of the third pixel electrodes PE3 may be electrically connected to first data lines DL1 that they overlap. Accordingly, as the first data lines DL1 are located to be adjacent to one another, but to be spaced apart from the second data lines DL2, the occurrence of data coupling can be reduced or prevented when charging the first data lines DL1 and the second data lines DL2.

FIG. 8 is a circuit diagram of a pixel of the display device of FIG. 1.

Referring to FIG. 8, a pixel SP may be connected to a first gate line GWL, a second gate line GCL, a third gate line GIL, a fourth gate line GBL, an emission control line EML, a data line DL, a driving voltage line VDDL, a first initialization voltage line VIL1, a second initialization voltage line VIL2, a bias voltage line VBL, and a low-potential line VSSL.

The pixel SP may include a pixel circuit PC and a light-emitting element ED. The pixel circuit PC may be located in one of the pixel circuit areas PCA of FIG. 7, and the structure of the pixel circuit PC is not limited to that illustrated in FIG. 8. For example, the pixel circuit PC may include first through eighth transistors ST1 through ST8 and a first capacitor C1. In another example, at least one of the first through eighth transistors ST1 through ST8 may be omitted from, or at least one transistor may be additionally provided in, the pixel SP.

The first transistor ST1 may control a driving current to be applied to the light-emitting element ED. The first transistor ST1 may include a gate electrode, a first electrode, and a second electrode. The gate electrode of the first transistor ST1 may be connected to a third node N3, the first electrode of the first transistor ST1 may be connected to a first node N1, and the second electrode of the first transistor ST1 may be connected to a second node N2. For example, the first and second electrodes of the first transistor ST1 may be source and drain electrodes, respectively, but the present disclosure is not limited thereto.

The first transistor ST1 may control a source-drain current Isd (hereinafter, the driving current) in accordance with a data voltage applied to the gate electrode of the first transistor ST1. The driving current Isd, which flows through the channel of the first transistor ST1, may be proportional to the square of the difference between a voltage Vsg between the source and gate electrodes of the first transistor ST1 and a threshold voltage Vth of the first transistor ST1 (e.g., Isd=k× (Vsg−Vth)$^2$ where k is a proportional coefficient determined by the structure and physical characteristics of the first transistor ST1).

The light-emitting element ED may receive the driving current Isd, and may thus emit light. The amount of light emitted by the light-emitting element ED or the luminance of the light-emitting element ED may be proportional to the magnitude of the driving current Isd. The light-emitting element ED may include a first electrode, a second electrode, and a light-emitting layer located between the first and second electrodes. The first electrode of the light-emitting element ED may be connected to a fourth node N4. The first electrode of the light-emitting element ED may be connected to a second electrode of the sixth transistor ST6, and to a first electrode of the seventh transistor ST7, through the fourth node N4. For example, the first electrode of the light-emitting element ED may be an anode or a pixel electrode PE, and the second electrode may be a cathode or a common electrode (e.g., common electrode CAT of FIG. 9). However, the present disclosure is not limited to this example.

The second transistor ST2 may be turned on by a first gate signal from the first gate line GWL to electrically connect the data line DL and the first node N1, which is the first electrode of the first transistor ST1. The first gate signal may be the scan write signal GW of FIG. 6, but the present disclosure is not limited thereto. As the second transistor ST2 is turned on by the first gate signal, the second transistor ST2 may provide a data voltage to the first node N1. A gate electrode of the second transistor ST2 may be connected to the first gate line GWL, a first electrode of the second transistor ST2 may be connected to the data line DL, and a second electrode of the second transistor ST2 may be connected to the first node N1. The second electrode of the second transistor ST2 may be connected to the first electrode of the first transistor ST1, to a second electrode of the fifth transistor ST5, and to a second electrode of the eighth transistor ST8 through the first node N1. For example, the first and second electrodes of the second transistor ST2 may be source and drain electrodes, respectively, but the present disclosure is not limited thereto.

The third transistor ST3 may be turned on by a second gate signal from the second gate line GCL to electrically connect the second node N2, which is the second electrode of the first transistor ST1, and the third node N3, which is the gate electrode of the first transistor ST1. A gate electrode of the third transistor ST3 may be connected to the second gate line GCL, a first electrode of the third transistor ST3 may be connected to the second node N2, and a second electrode of the third transistor ST3 may be connected to the third node N3. The first electrode of the third transistor ST3 may be connected to the second electrode of the first transistor ST1, and to a first electrode of the sixth transistor ST6, through the second node N2. The second electrode of the third transistor ST3 may be connected to the gate electrode of the first transistor ST1, to a first electrode of the fourth transistor ST4, and to a first capacitor electrode of the first capacitor C1 through the third node N3. For example, the first and second electrodes of the third transistor ST3 may be drain and source electrodes, respectively, but the present disclosure is not limited thereto.

The fourth transistor ST4 may be turned on by a third gate signal from the third gate line GIL to electrically connect the third node N3, which is the gate electrode of the first transistor ST1, and the first initialization voltage line VIL1. As the fourth transistor ST4 is turned on by the third gate signal, the gate electrode of the first transistor ST1 may be discharged to be as low as a first initialization voltage. A gate electrode of the fourth transistor ST4 may be connected to the third gate line GIL, a first electrode of the fourth transistor ST4 may be connected to the third node N3, and a second electrode of the fourth transistor ST4 may be connected to the first initialization voltage line VIL1. The first electrode of the fourth transistor ST4 may be connected to the gate electrode of the first transistor ST1, to the second electrode of the third transistor ST3, and to the first capacitor electrode of the first capacitor C1, through the third node N3. For example, the first and second electrodes of the fourth transistor ST4 may be drain and source electrodes, respectively, but the present disclosure is not limited thereto.

The fifth transistor ST5 may be turned on by an emission signal from the emission control line EML to electrically connect the driving voltage line VDDL and the first node N1, which is the first electrode of the first transistor ST1. A gate electrode of the fifth transistor ST5 may be connected to the emission control line EML, a first electrode of the fifth transistor ST5 may be connected to the driving voltage line VDDL, and a second electrode of the fifth transistor ST5 may be connected to the first node N1. The second electrode of the fifth transistor ST5 may be connected to the first electrode of the first transistor ST1, to the second electrode of the second transistor ST2, and to the second electrode of the eighth transistor ST8, through the first node N1. For example, the first and second electrodes of the fifth transistor ST5 may be source and drain electrodes, respectively, but the present disclosure is not limited thereto.

The sixth transistor ST6 may be turned on by the emission signal from the emission control line EML to electrically connect the second node N2, which is the second electrode of the first transistor ST1, and the fourth node N4, which is the first electrode of the light-emitting element ED. A gate electrode of the sixth transistor ST6 may be connected to the emission control line EML, a first electrode of the sixth transistor ST6 may be connected to the second node N2, and a second electrode of the sixth transistor ST6 may be connected to the fourth node N4. The first electrode of the sixth transistor ST6 may be connected to the second electrode of the first transistor ST1, and to the first electrode of the third transistor ST3, through the second node N2. The second electrode of the sixth transistor ST6 may be connected to the first electrode of the light-emitting element ED, and to a first electrode of the seventh transistor ST7, through the fourth node N4. For example, the first and second electrodes of the sixth transistor ST6 may be source and drain electrodes, respectively, but the present disclosure is not limited thereto.

When the fifth transistor ST5, the first transistor ST1, and the sixth transistor ST6 are all turned on, the diving current Isd may be applied to the light-emitting element ED.

The seventh transistor ST7 may be turned on by a fourth gate signal from the fourth gate line GBL to electrically connect the second initialization voltage line VIL2 and the fourth node N4, which is the first electrode of the light-emitting element ED. As the seventh transistor ST7 is turned on by the fourth gate signal, the first electrode of the light-emitting element ED may be discharged to be as low as a second initialization voltage. For example, first, second, and third pixel circuits may be supplied with different second initialization voltages, but the present disclosure is not limited thereto. A gate electrode of the seventh transistor ST7 may be connected to the fourth gate line GBL, a first electrode of the seventh transistor ST7 may be connected to the fourth node N4, and a second electrode of the seventh transistor ST7 may be connected to the second initialization voltage line VIL2. The first electrode of the seventh transistor ST7 may be connected to the first electrode of the light-emitting element ED, and to the second electrode of the sixth transistor ST6, through the fourth node N4.

The eighth transistor ST8 may be turned on by the fourth gate signal from the fourth gate line GBL to electrically connect the bias voltage line VBL and the first node N1, which is the first electrode of the first transistor ST1. As the eighth transistor ST8 is turned on by the fourth gate signal, the eighth transistor ST8 may provide a bias voltage to the first node N1. A gate electrode of the eighth transistor ST8 may be connected to the fourth gate line GBL, a first electrode of the eighth transistor ST8 may be connected to the bias voltage line VBL, and a second electrode of the eighth transistor ST8 may be connected to the first node N1. The first electrode of the eighth transistor ST8 may be connected to the first electrode of the first transistor ST1, to the second electrode of the second transistor ST2, and to the second electrode of the fifth transistor ST5, through the first node N1. For example, the first and second electrodes of the eighth transistor ST8 may be source and drain electrodes, respectively, but the present disclosure is not limited thereto.

The first, second, fifth, sixth, seventh, and eighth transistors ST1, ST2, ST5, ST6, ST7, and ST8 may include silicon (Si)-based semiconductor regions. For example, the first, second, fifth, sixth, seventh, and eighth transistors ST1, ST2, ST5, ST6, ST7, and ST8 may include semiconductor regions formed of low-temperature polycrystalline silicon (LTPS). The semiconductor regions formed of LTPS may have suitable electron mobility and turn-on characteristics. As the display device 10 includes the first, second, fifth, sixth, seventh, and eighth transistors ST1, ST2, ST5, ST6, ST7, and ST8, which have suitable turn-on characteristics, the display device 10 can stably and efficiently drive the pixel SP.

The first, second, fifth, sixth, seventh, and eighth transistors ST1, ST2, ST5, ST6, ST7, and ST8 may be p-type transistors. For example, the first, second, fifth, sixth, seventh, and eighth transistors ST1, ST2, ST5, ST6, ST7, and ST8 may output currents input to their first electrodes to their second electrodes based on gate-low voltages applied to their gate electrodes.

The third and fourth transistors ST3 and ST4 may include oxide-based semiconductor regions. For example, each of the third and fourth transistors ST3 and ST4 may have a coplanar structure in which a gate electrode is located above an oxide-based semiconductor region. Transistors having the coplanar structure have suitable leakage current characteristics, and can reduce power consumption because of being able to be driven at low frequency. As the display device 10 includes the third and fourth transistors ST3 and ST4, which have suitable leakage current characteristics, the display device 10 can stably maintain the voltage in the pixel SP.

The third and fourth transistors ST3 and ST4 may be n-type transistors. For example, the third and fourth transistors ST3 and ST4 may output currents input to their first electrodes to their second electrodes based on gate-high voltages applied to their gate electrodes.

The first capacitor C1 may be connected between the third node N3, which is the gate electrode of the first transistor ST1, and the driving voltage line VDDL. For example, the first capacitor electrode of the first capacitor C1 may be connected to the third node N3, and a second capacitor electrode of the first capacitor C1 may be connected to the driving voltage line VDDL. Accordingly, the potential difference between the driving voltage line VDDL and the gate electrode of the first transistor ST1 can be maintained.

Figure 9:
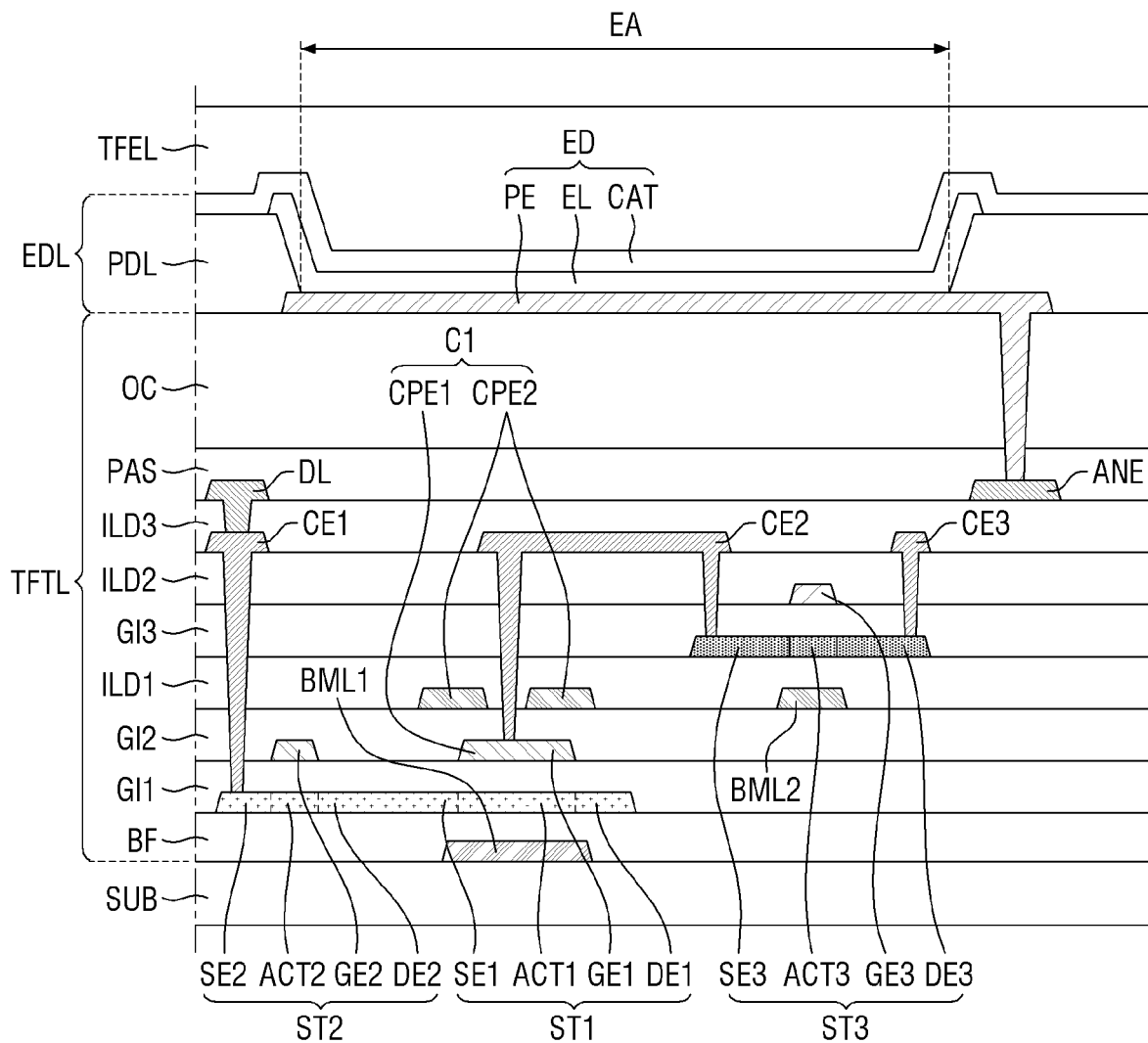
FIG. 9 is a cross-sectional view of the pixel of FIG. 8.

FIG. 9 is a cross-sectional view of the pixel of FIG. 8.

Referring to FIG. 9, the first transistor ST1 may include a semiconductor region ACT1, a gate electrode GE1, a first electrode SE1, and a second electrode DE1. The semiconductor region ACT1, the first electrode SE1, and the second electrode DE1 of the first transistor ST1 may be located in a first active layer ACTL1, and the gate electrode GE1 of the first transistor ST1 may be located in a first gate layer GTL1. The gate electrode GE1 of the first transistor ST1 may be part of a first capacitor electrode CPE1 in the first gate layer GTL1, and may overlap with the semiconductor region ACT1. For example, the semiconductor region ACT1 of the first transistor ST1 may include LTPS.

The gate electrode GE1 of the first transistor ST1 may be electrically connected to a second electrode SE3 of the third transistor ST3 through a second connection electrode CE2 in a first source metal layer SDL1. The first electrode SE1 of the first transistor ST1 and a second electrode DE2 of the second transistor ST2 may be formed in one body. The second electrode DE1 of the first transistor ST1 may be electrically connected to a first electrode DE3 of the third transistor ST3, which is located in a second active layer ACTL2, through a third connection electrode CE3 in the first source metal layer SDL1.

The second transistor ST2 may include a semiconductor region ACT2, a gate electrode GE2, a first electrode SE2, and the second electrode DE2. The semiconductor region ACT2, the first electrode SE2, and the second electrode DE2 of the second transistor ST2 may be located in the first active layer ACTL1, and the gate electrode GE2 of the second transistor ST2 may be located in the first gate layer GTL1.

The gate electrode GE2 of the second transistor ST2 may overlap with the semiconductor region ACT2 of the second transistor ST2. For example, the semiconductor region ACT2 of the second transistor ST2 may include LTPS. The first electrode SE2 of the second transistor ST2 may be electrically connected to the data line DL in a second source metal layer SDL2 through a first connection electrode CE1 in the first source metal layer SDL1.

The third transistor ST3 may include a semiconductor region ACT3, a gate electrode GE3, the first electrode DE3, and the second electrode SE3. The semiconductor region ACT3, the first electrode DE3, and the second electrode SE3 of the third transistor ST3 may be located in the second active layer ACTL2, and the gate electrode GE3 of the third transistor ST3 may be located in a third gate layer GTL3. The gate electrode GE3 of the third transistor ST3 may overlap with the semiconductor region ACT3 of the third transistor ST3. For example, the semiconductor region ACT3 of the third transistor ST3 may include an oxide.

The first electrode DE3 of the third transistor ST3 may be electrically connected to the second electrode DE1 of the first transistor ST1, which is located in the first active layer ACTL1, through the third connection electrode CE3 in the first source metal layer SDL1. The second electrode SE3 of the third transistor ST3 may be electrically connected to the gate electrode GE1 of the first transistor ST1 through the second connection electrode CE2.

The first capacitor C1 may include the first capacitor electrode CPE1 and a second capacitor electrode CPE2. The first and second capacitor electrodes CPE1 and CPE2 of the first capacitor C1 may overlap with each other. The first capacitor electrode CPE1 of the first capacitor C1 may be located in the first gate layer GTL1, and the second capacitor electrode CPE2 of the first capacitor C1 may be located in a second gate layer GTL2. The first capacitor electrode CPE1 of the first capacitor C1 may include the gate electrode GE1 of the first transistor ST1, and the second capacitor electrode CPE2 of the first capacitor C1 may be electrically connected to the driving voltage line VDDL.

The display panel 100 may include a substrate SUB, a thin-film transistor (TFT) layer TFTL, a light-emitting element layer EDL, and an encapsulation layer TFEL.

The substrate SUB may be a base substrate or a base member. The substrate SUB may be a flexible substrate that is bendable, foldable, or rollable. For example, the substrate SUB may include a polymer resin, such as polyimide (PI), but the present disclosure is not limited thereto. In another example, the substrate SUB may include a glass material or a metal material.

The TFT layer TFTL may include a first metal layer BML1, a buffer layer BF, the first active layer ACTL1, a first gate insulating layer GI1, the first gate layer GTL1, a second gate insulating layer GI2, the second gate layer GTL2, a first interlayer insulating layer ILD1, a second active layer ACT2, a third gate insulating layer GI3, the third gate layer GTL3, a second interlayer insulating layer ILD2, the first source metal layer SDL1, a third interlayer insulating layer ILD3, the second source metal layer SDL2, a passivation layer PAS, and a planarization layer OC.

The first metal layer BML1 may be located on the substrate SUB. The first metal layer BML1 may overlap with the semiconductor region ACT1 of the first transistor ST1. For example, the first metal layer BML1 may include a light-blocking material. The first metal layer BML1 may be located below the first transistor ST1, and may block or reduce light incident upon the first transistor ST1.

The buffer layer BF may be located on the first metal layer BML1. For example, the buffer layer BF may include an inorganic film capable of reducing or preventing the penetration of the air or moisture. For example, the buffer layer BF may include a plurality of inorganic films that are alternately stacked.

The first active layer ACTL1 may be located on the buffer layer BF. The first active layer ACTL1 may include a Si-based material. For example, the first active layer ACTL1 may be formed of LTPS. The first active layer ACTL1 may include the semiconductor region ACT1, the first electrode SE1, and the second electrode DE1 of the first transistor ST1, and may include the semiconductor region ACT2, the first electrode SE2, and the second electrode DE2 of the second transistor ST2.

The first gate insulating layer GI1 may be located on the first active layer ACTL1. The first gate insulating layer GI1 may insulate the first active layer ACTL1 and the first gate layer GTL1.

The first gate layer GTL1 may be located on the first gate insulating layer GI1. The first gate layer GTL1 may include the gate electrodes GE1 and GE2 of the first and second transistors ST1 and ST2 and the first capacitor electrode CPE1 of the first capacitor C1.

The second gate insulating layer GI2 may be located on the first gate layer GTL1. The second gate insulating layer GI2 may insulate the first gate layer GTL1 and the second gate layer GTL2.

The second gate layer GTL2 may be located on the second gate insulating layer GI2. The second gate layer GTL2 may include the second capacitor electrode CPE2 of the first capacitor C1 and the second metal layer BML2. The second metal layer BML2 may overlap with the semiconductor region ACT3 of the third transistor ST3. The second metal layer BML2 may include a light-blocking material. The second metal layer BML2 may be located below the third transistor ST3, and may block or reduce light incident upon the third transistor ST3.

The first interlayer insulating layer ILD1 may be located on the second gate layer GTL2. The first interlayer insulating layer ILD1 may insulate the second gate layer GTL2 and the second active layer ACTL2.

The second active layer ACTL2 may be located on the first interlayer insulating layer ILD1. The second active layer ACTL2 may include an oxide-based material. The second active layer ACTL2 may include the semiconductor region ACT3, the first electrode DE3, and the second electrode SE3 of the third transistor ST3.

The third gate insulating layer GI3 may be located on the second active layer ACTL2. The third gate insulating layer GI3 may insulate the second active layer ACTL2 and the third gate layer GTL3.

The third gate layer GTL3 may be located on the third gate insulating layer GI3. The third gate layer GTL3 may include the gate electrode GE3 of the third transistor ST3.

The second interlayer insulating layer ILD2 may be located on the third gate layer GTL3. The second interlayer insulating layer ILD2 may insulate the third gate layer GTL3 and the first source metal layer SDL1.

The first source metal layer SDL1 may be located on the second interlayer insulating layer ILD2. The first source metal layer SDL1 may include the first, second, and third connection electrodes CE1, CE2, and CE3.

The third interlayer insulating layer ILD3 may be located on the first source metal layer SDL1. The third interlayer insulating layer ILD3 may insulate the first and second source metal layers SDL1 and SDL2.

The second source metal layer SDL2 may be located on the third interlayer insulating layer ILD3. The second source metal layer SDL2 may include the data line DL and an anode connection electrode ANE. The data line DL may be one of the first data lines DL1 or the second data lines DL2 of FIG. 7, but the present disclosure is not limited thereto. The anode connection electrode ANE may provide a driving current received from the pixel circuit PC to the light-emitting element ED. The anode connection electrode ANE may be one of first anode connection electrodes ANE1, second anode connection electrodes ANE2, or third anode connection electrodes ANE3 of FIG. 7, but the present disclosure is not limited thereto.

The passivation layer PAS may be located on the second source metal layer SDL2. The passivation layer PAS may protect the pixel circuit PC of the pixel SP.

The planarization layer OC may be located on the passivation layer PAS. The planarization layer OC may planarize the top of the TFT layer TFTL. The planarization layer OC may include an organic insulating material, such as PI.

The light-emitting element layer EDL may include a pixel-defining film PDL and the light-emitting element ED. The pixel-defining film PDL may be located on the planarization layer OC. The pixel-defining film PDL may define an emission area EA. The pixel-defining film PDL may include an organic insulating material, such as PI. The emission area EA may be one of the first emission areas EA1, the second emission areas EA2, or the third emission areas EA3 of FIG. 7, but the present disclosure is not limited thereto.

The light-emitting element ED may include a pixel electrode PE, a light-emitting layer EL, and a common electrode CAT. The pixel electrode PE may be located on the planarization layer OC. The pixel electrode PE may overlap with the emission area EA defined by the pixel-defining film PDL. The pixel electrode PE may receive a driving current from the pixel circuit PC. The pixel electrode PE may be one of the first pixel electrodes PE1, the second pixel electrodes PE2, or the third pixel electrodes PE3 of FIG. 7, but the present disclosure is not limited thereto.

The light-emitting layer EL may be located on the pixel electrode PE. For example, the light-emitting layer EL may be an organic light-emitting layer formed of an organic material, but the present disclosure is not limited thereto. In a case where the light-emitting layer EL is an organic light-emitting layer, the pixel circuit PC may apply a voltage (e.g., predetermined voltage) to the pixel electrode PE. Then, when the common electrode CAT receives a common voltage or a cathode voltage, holes and electrons may move to the organic light-emitting layer EL through a hole transport layer and an electron transport layer, respectively, and may combine together in the organic light-emitting layer EL, thereby emitting light.

The common electrode CAT may be located on the light-emitting layer EL. For example, the common electrode CAT may be implemented as an electrode that is common to all pixels SP, rather than as individual electrodes respectively for each individual pixel SP. The common electrode CAT may be located on the light-emitting layer EL, in a plurality of emission areas EA, and on the pixel-defining film PDL, in areas other than the emission areas EA.

The encapsulation layer TFEL may be located on the common electrode CAT and may cover the light-emitting element ED. The encapsulation layer TFEL may include at least one inorganic film, and may reduce or prevent the penetration of oxygen or moisture into the light-emitting element ED. The encapsulation layer TFEL may further include at least one organic film, and may protect the light-emitting element ED from a foreign material, such as dust.

Figure 10:
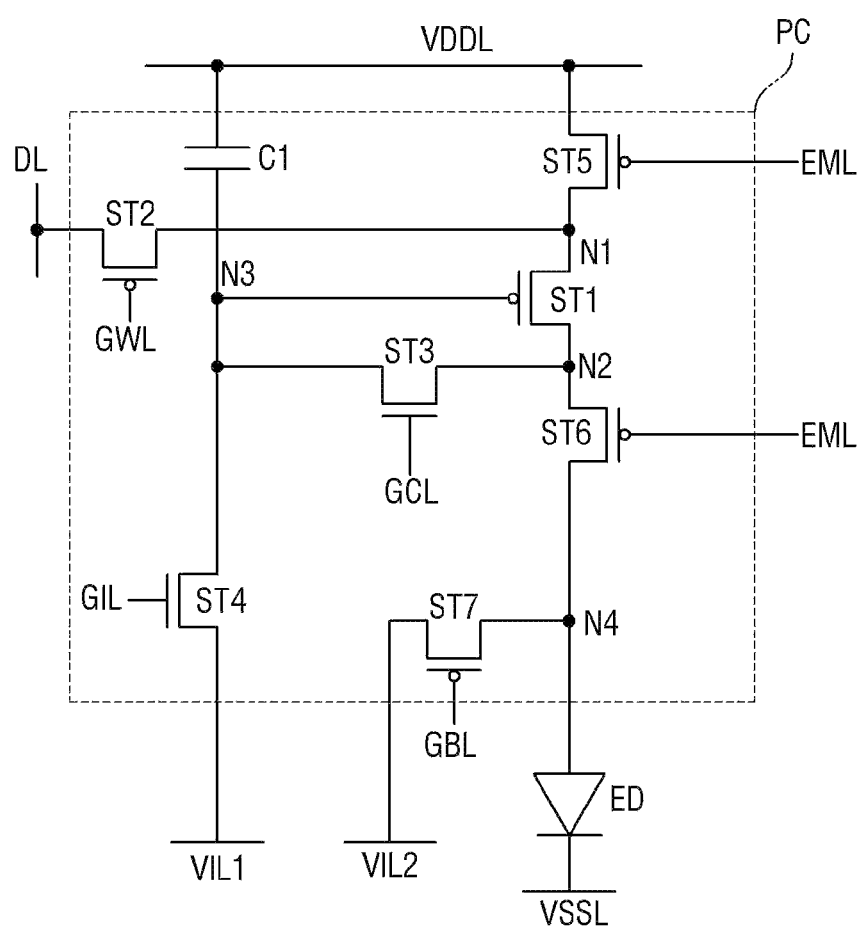
FIG. 10 is a circuit diagram of another pixel of the display device of FIG. 1.

FIG. 10 is a circuit diagram of another pixel of the display device of FIG. 1. A pixel SP of FIG. 10 differs from the pixel SP of FIG. 8 in that it does not include an eighth transistor ST8, and will hereinafter be described while focusing mainly on the differences with the one or more embodiments corresponding to FIG. 8.

Referring to FIG. 10, the pixel SP may be connected to a first gate line GWL, a second gate line GCL, a third gate line GIL, a fourth gate line GBL, an emission control line EML, a data line DL, a driving voltage line VDDL, a first initialization voltage line VIL1, a second initialization voltage line VIL2, and a low-potential line VSSL.

The pixel SP may include a pixel circuit PC and a light-emitting element ED. The pixel circuit PC may be located in one of the pixel circuit areas PCA of FIG. 7, and the structure of the pixel circuit PC is not limited to that illustrated in FIG. 10. For example, the pixel circuit PC may include first through seventh transistors ST1 through ST7 and a first capacitor C1.

The structures of, and the connections between, the first through seventh transistors ST1 through ST7 and the first capacitor C1 may be substantially the same as the structures of, and the connections between, the first through seventh transistors ST1 through ST7 and the first capacitor C1 of FIG. 8.

The first, second, fifth, sixth, and seventh transistors ST1, ST2, ST5, ST6, and ST7 may include Si-based semiconductor regions. For example, the first, second, fifth, sixth, and seventh transistors ST1, ST2, ST5, ST6, and ST7 may include semiconductor regions formed of LTPS. The semiconductor regions formed of LTPS may have suitable electron mobility and turn-on characteristics. As the display device includes the first, second, fifth, sixth, and seventh transistors ST1, ST2, ST5, ST6, and ST7, which have suitable turn-on characteristics, the display device 10 can stably and efficiently drive the pixel SP.

The first, second, fifth, sixth, and seventh transistors ST1, ST2, ST5, ST6, and ST7 may be p-type transistors. For example, the first, second, fifth, sixth, and seventh transistors ST1, ST2, ST5, ST6, and ST7 may output currents input to their first electrodes to their second electrodes based on gate-low voltages applied to their gate electrodes.

The third and fourth transistors ST3 and ST4 may include oxide-based semiconductor regions. For example, each of the third and fourth transistors ST3 and ST4 may have a coplanar structure in which a gate electrode is located above an oxide-based semiconductor region. Transistors having the coplanar structure have suitable leakage current characteristics and can reduce power consumption because of being able to be driven at low frequency. As the display device 10 includes the third and fourth transistors ST3 and ST4, which have suitable leakage current characteristics, the display device 10 can stably maintain the voltage in the pixel SP.

The third and fourth transistors ST3 and ST4 may be n-type transistors. For example, the third and fourth transistors ST3 and ST4 may output currents input to their first electrodes to their second electrodes based on gate-high voltages applied to their gate electrodes.

Figure 11:
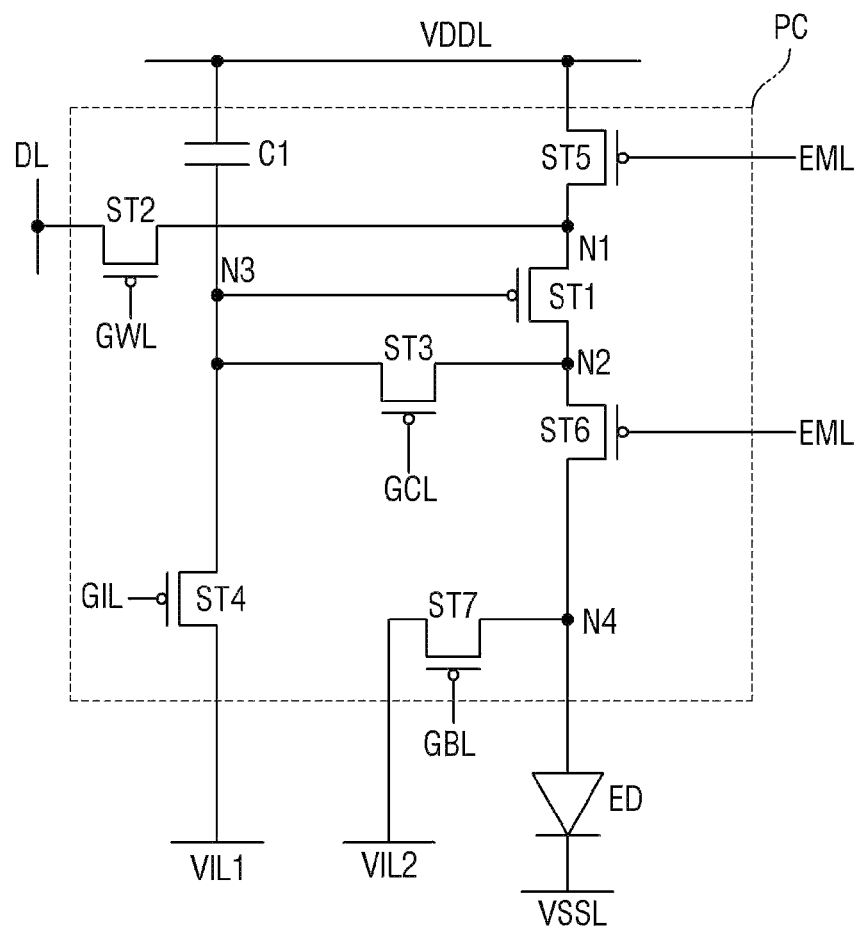
FIG. 11 is a circuit diagram of another pixel of the display device of FIG. 1.

FIG. 11 is a circuit diagram of another pixel of the display device of FIG. 1. A pixel SP of FIG. 11 differs from the pixel SP of FIG. 10 in the structures of third and fourth transistors ST3 and ST4 and will hereinafter be described, focusing mainly on the differences with the one or more embodiments corresponding to FIG. 10.

Referring to FIG. 11, the pixel SP may be connected to a first gate line GWL, a second gate line GCL, a third gate line GIL, a fourth gate line GBL, an emission control line EML, a data line DL, a driving voltage line VDDL, a first initialization voltage line VIL1, a second initialization voltage line VIL2, and a low-potential line VSSL.

The pixel SP may include a pixel circuit PC and a light-emitting element ED. The pixel circuit PC may be located in one of the pixel circuit areas PCA of FIG. 7, and the structure of the pixel circuit PC is not limited to that illustrated in FIG. 11. For example, the pixel circuit PC may include first through seventh transistors ST1 through ST7 and a first capacitor C1.

The structures of, and the connections between, the first, second, fifth, sixth, and seventh transistors ST1, ST2, ST5, ST6, and ST7 and the first capacitor C1 may be substantially the same as the structures of, and the connections between, the first, second, fifth, sixth, and seventh transistors ST1, ST2, ST5, ST6, and ST7 and the first capacitor C1 of FIG. 8.

The third transistor ST3 may be turned on by a second gate signal from the second gate line GCL to electrically connect a second node N2, which is a second electrode of the first transistor ST1, and a third node N3, which is a gate electrode of the first transistor ST1. A gate electrode of the third transistor ST3 may be connected to the second gate line GCL, a first electrode of the third transistor ST3 may be connected to the second node N2, and a second electrode of the third transistor ST3 may be connected to the third node N3. The first electrode of the third transistor ST3 may be connected to the second electrode of the first transistor ST1, and to a first electrode of the sixth transistor ST6, through the second node N2. The second electrode of the third transistor ST3 may be connected to a gate electrode of the first transistor ST1, to a first electrode of the fourth transistor ST4, and to a first capacitor electrode of the first capacitor C1, through the third node N3. For example, the first and second electrodes of the third transistor ST3 may be source and drain electrodes, respectively, but the present disclosure is not limited thereto.

The fourth transistor ST4 may be turned on by a third gate signal from the third gate line GIL to electrically connect the third node N3, which is the gate electrode of the first transistor ST1, and the first initialization voltage line VIL1. As the fourth transistor ST4 is turned on by the third gate signal, the gate electrode of the first transistor ST1 may be discharged to be as low as a first initialization voltage. A gate electrode of the fourth transistor ST4 may be connected to the third gate line GIL, the first electrode of the fourth transistor ST4 may be connected to the third node N3, and a second electrode of the fourth transistor ST4 may be connected to the first initialization voltage line VIL1. The first electrode of the fourth transistor ST4 may be connected to the gate electrode of the first transistor ST1, the second electrode of the third transistor ST3, and the first capacitor electrode of the first capacitor C1 through the third node N3. For example, the first and second electrodes of the fourth transistor ST4 may be source and drain electrodes, respectively, but the present disclosure is not limited thereto.

The first through seventh transistors ST1 through ST7 may include Si-based semiconductor regions. For example, the first through seventh transistors ST1 through ST7 may include semiconductor regions formed of LTPS. The semiconductor regions formed of LTPS may have suitable electron mobility and turn-on characteristics. As the display device 10 includes the first through seventh transistors ST1 through ST7, which have suitable turn-on characteristics, the display device 10 can stably and efficiently drive the pixel SP.

The first through seventh transistors ST1 through ST7 may be p-type transistors. For example, the first through seventh transistors ST1 through ST7 may output currents input to their first electrodes to their second electrodes based on gate-low voltages applied to their gate electrodes.

Aspects according to the embodiments are not limited by the contents disclosed above, and more various aspects are included in this specification. As described above, the embodiments of the present disclosure have been disclosed through the detailed description and the drawings. However, those skilled in the art or those of ordinary skill in the art will appreciate that various modifications and changes are possible without departing from the scope of the present disclosure as set forth in the claims below. Therefore, the scope of the present disclosure is not limited to the detailed description above, but should be determined by the appended claims, with functional equivalents thereof to be included therein.

What is claimed is:

1. A display device comprising:
   first emission areas, second emission areas, and third emission areas for respectively emitting colors of light;
   first pixel electrodes, second pixel electrodes, and third pixel electrodes overlapping the first emission areas, the second emission areas, and the third emission areas, respectively;
   first data lines respectively connected to the first pixel electrodes, and overlapping some of the first emission areas;
   second data lines respectively electrically connected to the second pixel electrodes, overlapping some others of the first emission areas, and being spaced apart from the first data lines; and
   a demultiplexer configured to divide and output corresponding portions of an input, which is received from one fan-out line, to the first data lines and the second data lines, and
   wherein some of the first data lines are adjacent one another, and are electrically connected to some of the first pixel electrodes overlapping the second data lines, and
   wherein others of the first data lines are adjacent one another, and are electrically connected to others of the first pixel electrodes overlapping the first data lines.

2. The display device of claim 1, wherein the first data lines respectively overlap some of the third emission areas, and
   wherein the second data lines respectively overlap others of the third emission areas.

3. The display device of claim 2, wherein the first data lines comprise adjacent pairs of the first data lines,
   wherein some of the first data lines are electrically connected to ones of the third pixel electrodes overlapping the second data lines, and
   wherein others of the first data lines are electrically connected to ones of the third pixel electrodes that overlap the others of the first data lines.

4. The display device of claim 1, wherein the second emission areas are between respective ones of the first and second data lines in plan view.

5. The display device of claim 1, further comprising first pixel circuits, second pixel circuits, and third pixel circuits for providing driving currents to the first pixel electrodes, the second pixel electrodes, and the third pixel electrodes, respectively, wherein the first data lines overlap the first pixel circuits and the third pixel circuits, and wherein the second data lines overlap the second pixel circuits.

6. The display device of claim 5, wherein respective ones of the first data lines and the second data lines are spaced apart from one another with the first pixel circuits and the second pixel circuits therebetween, or with the second pixel circuits and the third pixel circuits therebetween.

7. The display device of claim 5, wherein the first pixel circuits, the second pixel circuits, and the third pixel circuits comprise:

a first transistor for controlling a driving current to be provided to a corresponding one of the first, second, or third pixel electrodes;

a second transistor for supplying a data voltage to a gate electrode of the first transistor;

a third transistor connected between the gate electrode of the first transistor and a source electrode of the first transistor; and a fourth transistor for discharging the gate electrode of the first transistor to a first initialization voltage.

8. The display device of claim 7, wherein the first and second transistors comprise semiconductor regions comprising low-temperature polycrystalline silicon (LTPS), and wherein the third and fourth transistors comprise oxide-based semiconductor regions.

9. The display device of claim 1, wherein the first emission areas and the third emission areas are alternately arranged in a first direction, and in a second direction perpendicular to the first direction, and wherein the second emission areas are spaced apart from the first emission areas or the third emission areas in a third direction between the first and second directions.

10. The display device of claim 1, wherein the first emission areas and the third emission areas are alternately arranged in first rows and first columns, and wherein the second emission areas are arranged in second rows between respective ones of the first rows, and in second columns between respective ones of the first columns.

11. A display device comprising:

first emission areas, second emission areas, and third emission areas for emitting respective colors of light;

first pixel electrodes, second pixel electrodes, and third pixel electrodes overlapping the first emission areas, the second emission areas, and the third emission areas, respectively;

n-th, (n+1)-th, and (n+2)-th fan-out lines (n being a positive integer) for providing data voltages;

an n-th first data line and an n-th second data line electrically connected to the n-th fan-out line;

an (n+1)-th first data line and an (n+1)-th second data line electrically connected to the (n+1)-th fan-out line; and an (n+2)-th first data line and an (n+2)-th second data line electrically connected to the (n+2)-th fan-out line, wherein the n-th and (n+1)-th second data lines are adjacent to each other, and wherein the (n+1)-th and (n+2)-th first data lines are adjacent to each other, and are spaced from the n-th and (n+1)-th second data lines.

12. The display device of claim 11, wherein the (n+1)-th first data line and the (n+2)-th first data line overlap some of the first emission areas, and wherein the n-th second data line and the (n+1)-th second data line overlap others of the first emission areas.

13. The display device of claim 11, wherein the (n+1)-th first data line and the (n+2)-th first data line overlap some of the third emission areas, and wherein the n-th second data line and the (n+1)-th second data line overlap others of the third emission areas.

14. The display device of claim 11, wherein the second emission areas are between the (n+1)-th second data line and the (n+2)-th first data line in plan view.

15. The display device of claim 11, wherein the (n+1)-th first data line is electrically connected to some first pixel electrodes overlapping the n-th second data line and the (n+1)-th second data line, and wherein the (n+2)-th first data line is electrically connected to other first pixel electrodes overlapping the (n+1)-th first data line and the (n+2)-th first data line.

16. The display device of claim 11, further comprising:

first pixel circuits, second pixel circuits, and third pixel circuits for providing driving currents to the first pixel electrodes, the second pixel electrodes, and the third pixel electrodes, respectively, wherein the first data lines overlap the first pixel circuits and the third pixel circuits, and wherein the second data lines overlap the second pixel circuits.

17. The display device of claim 16, wherein the first pixel circuits and the second pixel circuits, or the second pixel circuits and the third pixel circuits, are between the (n+1)-th first data line and the (n+1)-th second data line in plan view.

18. A display device comprising:

first emission areas and second emission areas for emitting respective colors of light;

first pixel electrodes and second pixel electrodes overlapping the first emission areas and the second emission areas, respectively;

first data lines electrically connected to the first pixel electrodes, some of the first data lines being adjacent to one another;

second data lines electrically connected to the second pixel electrodes, the second data lines being spaced apart from the first data lines, and some of the second data lines being adjacent to one another; and first pixel circuits, second pixel circuits, and third pixel circuits for providing driving currents to the first pixel electrodes, the second pixel electrodes and third pixel electrodes, respectively, and wherein the first data lines overlap the first pixel circuits and the third pixel circuits, and wherein the second data lines overlap the second pixel circuits, and wherein the first pixel circuits and the second pixel circuits comprise:

a first transistor for controlling a driving current to be provided to a corresponding first pixel electrode or a second pixel electrode;

a second transistor for supplying a data voltage to a gate electrode of the first transistor;

a third transistor connected between the gate electrode of the first transistor and a source electrode of the first transistor; and a fourth transistor for discharging the gate electrode of the first transistor to a first initialization voltage.

19. The display device of claim 18, wherein the first and second transistors comprise semiconductor regions comprising low-temperature polycrystalline silicon (LTPS), and wherein the third and fourth transistors comprise oxide-based semiconductor regions.

* * * * *